United States Patent
Ker et al.

(10) Patent No.: US 6,912,109 B1
(45) Date of Patent: Jun. 28, 2005

(54) POWER-RAIL ESD CLAMP CIRCUITS WITH WELL-TRIGGERED PMOS

(75) Inventors: Ming-Dou Ker, Hsinchu (TW); Mau-Lin Wu, Hsin Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 730 days.

(21) Appl. No.: 09/604,067

(22) Filed: Jun. 26, 2000

(51) Int. Cl.[7] ................................................. H02H 9/00

(52) U.S. Cl. .......................... 361/56; 361/111; 361/117

(58) Field of Search ......................... 361/56, 117, 111, 361/91.1, 113, 118

(56) References Cited

U.S. PATENT DOCUMENTS

| | | | |
|---|---|---|---|
| 4,855,620 A | 8/1989 | Duvvury et al. | 307/448 |
| 5,086,365 A | 2/1992 | Lien | 361/58 |
| 5,237,395 A | 8/1993 | Lee | 257/358 |
| 5,255,146 A | 10/1993 | Miller | 361/56 |
| 5,287,241 A | 2/1994 | Puar | 361/56 |
| 5,311,391 A | 5/1994 | Dungan et al. | 361/56 |
| 5,440,162 A | 8/1995 | Worley et al. | 257/355 |
| 5,610,791 A | 3/1997 | Voldman | 361/56 |
| 5,625,280 A | 4/1997 | Voldman | 323/284 |
| 5,631,793 A | 5/1997 | Ker et al. | 361/56 |
| 6,008,970 A | * 12/1999 | Maloney et al. | 361/56 |

OTHER PUBLICATIONS

Mead, Carver and Conwway, Lynn, Introduction to VLSI systems (1980) pp. 53–56.*
Stephen G. Beebe, Methodology for Layout Design and Optimization of ESD Protection Transistors, 1996 EOS/ESD Symp. Proc., pp. 265–275.
Polgreen et al., "Improving the ESD Failure Threshold of Silicides n–MOS Output Transistors by Ensuring Uniform Current Flow", IEEE Trans. Electron Devices, vol. 39, pp. 379–388, 1992.
Duvvury et al., "Dynamic Gate Coupling of NMOS for Efficient Output ESD Protection", Proc. of IRPS, 1992, pp. 141–150.
Duvvury et al., "Achieving Uniform nMOS Device Power Distribution for Sub–micron ESD Reliability", Tech. Dig. IEDM, 1992, pp. 131–134.
Ramaswamy et al., "EOS/ESD Reliability of Deep Sub–Micron NMOS Protection Devices", Proc. of IRPS, 1995, pp. 284–291.
Ker et al., "Capacitor–Couple ESD Protection Circuit for Deep–Submicron Low–Voltage CMOS ASIC", IEEE Trans, on VLSI Systems, vol. 4, pp. 307–321, Sep. 1996.
Ming–Dou Ker, "Whole–Chip ESD Protection Design with Efficient VDD–to–VSS ESD Clamp Circuits for Submicron CMOS VLSI"; IEEE Trans. on Electron Devices, vol. 46, No. 1, pp. 173–183, Jan. 1999.

(Continued)

*Primary Examiner*—Stephen W. Jackson

(57) ABSTRACT

A new ESD (Electrostatic Discharge) protection circuit with well-triggered PMOS is provided for application in power-rail ESD protection. A PMOS device is connected between the VDD and VSS power lines to sustain the ESD overstress current during the time that the ESD voltage is applied between the VDD and the VSS power lines. In deep sub-micron CMOS p-substrate technology, the weak point of ESD overstress control is typically associated with the NMOS device. For this reason, the invention uses a power-rail ESD clamp circuit that incorporates a PMOS device. Applying gate-coupled and N-well triggering techniques, the PMOS can be turned on more efficiently when the ESD overstress is present between the power lines. For p-substrate CMOS technology, it is difficult to couple a high voltage to the substrate of the NMOS device while high voltage is readily coupled to the N-well of a PMOS device. The proposed ESD clamp circuit can be applied efficiently to protect the ESD overstress between power rails.

28 Claims, 14 Drawing Sheets

OTHER PUBLICATIONS

Merrill et al., ESD Design Methodology, EOS/ESD Symp. Proc., 1994, EOS–16, pp. 141–149.

Dabral et al., Core Clamps for Low Voltage Technologies, EPS/ESD Symp. Proc., 1994, EOS–16, pp. 141–149.

Worley et al., "Sub–Micron Chip ESD Protection Schemes which Avoid Avalanching Junctions", EOS/ESD Symp. Proc., 1995, EOS–17, pp. 13–20.

Voldman et al., "Scaling, Optimization and Design Considerations of Electrostatic Discharge Protection Circuits in CMOS Technology", EOS/ESD Symp. Proc., pp. 251–260, 1993.

Amerasekera et al., "The Impact of Technology Scaling on ESD Robustness and Protection Circuit Design", EOS/ESD Symp. Proc. pp. 237–245, 1994.

Daniel et al., "Process and Design Optimization for Advanced CMOS I/O ESD Protection Devices", EOS/ESD Symp. Proc. pp. 206–213, 1990.

Chen et al., "Design Methodology for Optimizing Gate Driven ESD Protection Circuits in Submicron CMOS Processes", Proc. of EOS/ESD Symp., pp. 230–239, 1997.

Amerasekera et al., "Substrate Triggering and Salicide Effects on ESD Performance and Protection Circuit Design in Deep Submicron CMOS Processes", IEDM Tech. Digest 1995, pp. 547–550.

Anderson et al., "ESD Protection for Mixed–Voltage I/O Using NMOS Transistors Stacked in a Cascode Configuration", Proc. of EOS/ESD Symp., pp. 54–62, 1998.

Chen et al., "Design Methodology and Optimization of Gate–Driven NMOS ESD Protection Circuits in Submicron CMOS Processes", IEEE Trans. on Electron Devices, vol. 45, No. 12, pp. 2448–2456, Dec. 1998.

* cited by examiner

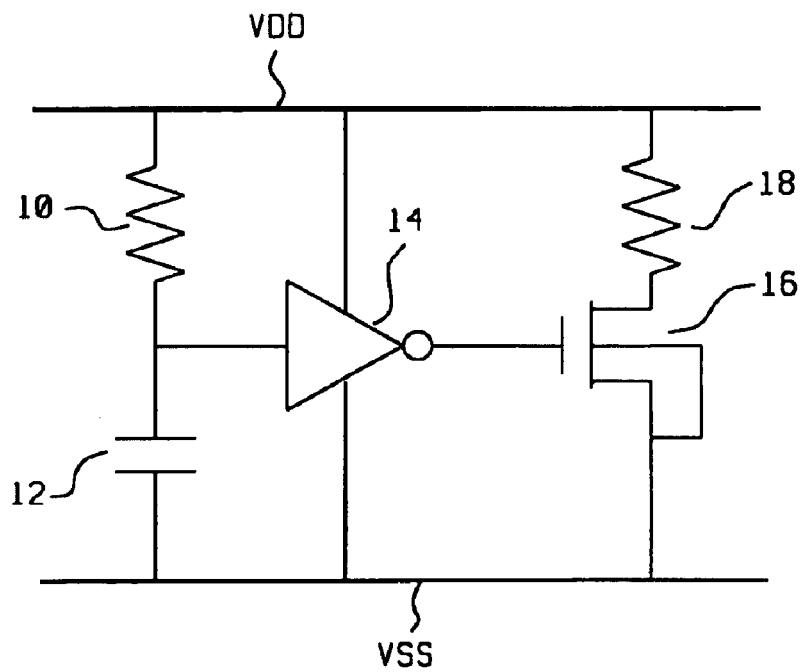
*FIG. 1 - Prior Art*
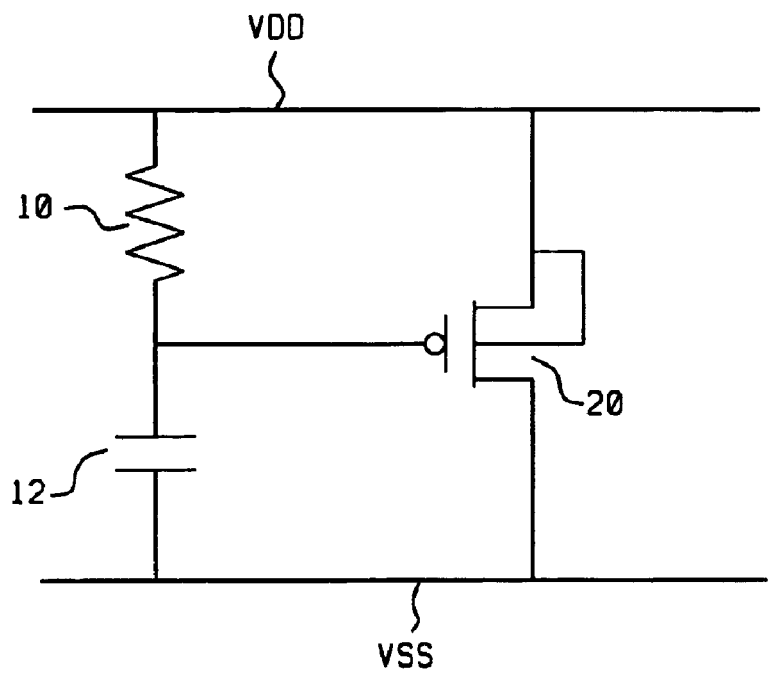
*FIG. 2 - Prior Art*

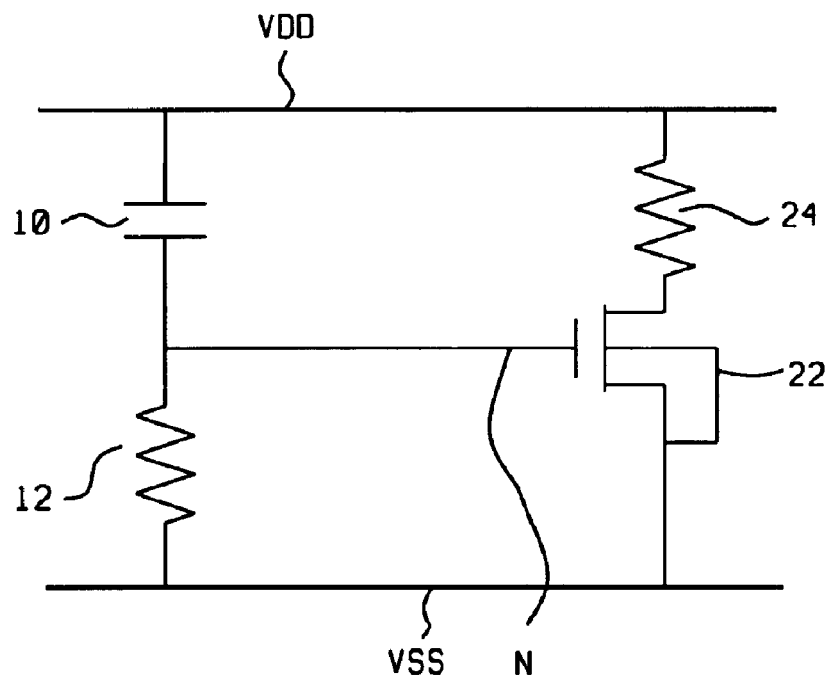
*FIG. 3 - Prior Art*
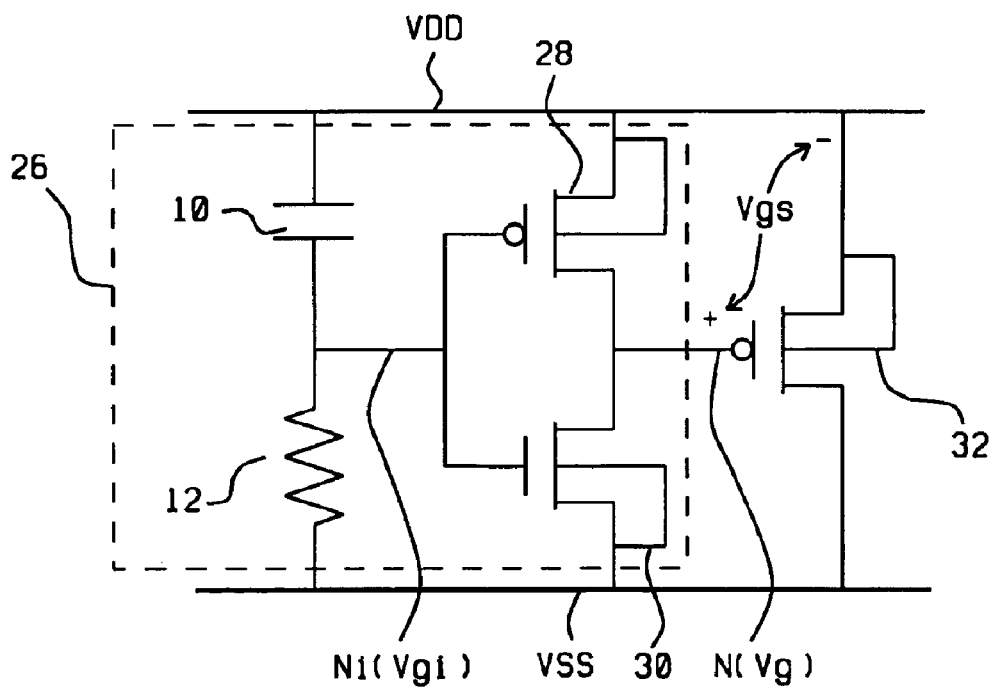
*FIG. 4*

US 6,912,109 B1

POWER-RAIL ESD CLAMP CIRCUITS WITH WELL-TRIGGERED PMOS

RELATED PATENT APPLICATION

This application is related to Ser. No. 09/378,948 filed on Aug. 23, 1999, assigned to a common assignee.

BACKGROUND OF THE INVENTION

(1) Field of the Invention

The invention relates to the fabrication of integrated circuit devices, and more particularly, to a method for creating an Electrostatic Discharge (ESD) protection circuit for well-triggered PMOS devices.

(2) Description of the Prior Art

In deep submicron CMOS technology, ESD damage has become one of the main reliability concerns. Processing techniques that are applied in advanced CMOS technology procedures can lead to degradation of the performance of ESD circuits that are part of Integrated Circuits (IC's). Examples of these advanced processing techniques are the formation of Lightly Doped Drain (LDD) regions in the MOSFET devices, the formation of salicided drain/source surface regions for MOSFET devices and the formation of extremely thin gate oxide layers underneath the gate electrodes of MOSFET devices. To improve the performance of ESD circuitry of deep submicron CMOS IC's, a number of design methods and approaches have been proposed and applied to I/O cells and Power/Ground cells of semiconductor devices. These methods include ESD protection devices, ESD protection circuits, ESD layout technique and process modifications.

For general industrial applications, the input/output pins of the Integrated Circuits must be able to sustain extreme voltage levels when in contact with an ESD source in excess of 2000 volts. In order to achieve this objective, ESD protection circuits are placed around the I/O pads of the IC's such that these ESD protection circuits protect the IC's against potential ESD damage. The ESD protection circuits shunt the electrostatic charges that originate in the ESD source away from the IC thereby preventing damage to the IC.

It had been shown that ESD clamp circuits that are implemented between power (VDD) and ground lines (VSS) can improve the ESD performance of the whole chip. For ESD clamp circuits of the VDD-to-VSS type, several patents have been filed during recent years [1–5]. Among these patents, some provide for the application of gate-driven techniques [6–7] while others apply substrate-driven techniques [8–9]. In some patents, for instance [1–2] and [4–5], NMOS has been used as an ESD clamp circuit while PMOS has been used as an ESD clamp circuit in other patents [3].

FIG. 1 shows the VDD-to-VSS ESD clamp circuit that is implemented using a resistor 10, a capacitor 12, an inverter 14 and an NMOS device 16 having a load resistance 18. This example is further detailed and is representative of the U.S. patents under References [1–2]. This circuit can help to efficiently turn on the NMOS device by making use of the delay of the RC time constant. For general cases, the value of the RC time constant is designed in the order of microseconds.

The VDD-to-VSS ESD clamp circuit implemented using a resistor 10, a capacitor 12 and a PMOS device 20 is shown in FIG. 2. This example is further detailed and is representative of the U.S. patents under Reference [3]. The delay caused by the RC time constant of the circuit, which is determined by the values of the resistor 10 and the capacitor 12, can help to turn on the PMOS device 20 if the ESD overstress occurs between the VDD and VSS power rails.

In other patents [4–5], the VDD-to-VSS ESD clamp circuit has been implemented using the gate-coupled effect, the schematic diagram for this application is shown in FIG. 3. When the ESD overstress voltage is between the VDD and VSS power rails, the voltage of the node N (Vg) is coupled to a high voltage VDD and causes the NMOS device 22 to turn on. After the NMOS device 22, having a load resistance of 24, is turned on, thereby passing the ESD current from VDD to VSS. Therefore, the ESD level of this ESD clamp circuit is improved [6–7]. However, the gate-driven effect has been confirmed to cause a sudden degradation on the ESD level of ESD-protection devices when the voltage of the gate is too high [8–9]. On the other hand, the substrate-triggered effect can continue to increase the ESD level of ESD-protection devices [9]. Therefore, the substrate-triggering technique is used to design the efficient ESD clamp circuit in this invention. It must further be realized that while using the p-substrate CMOS process, it is easier to control the voltage of the N-well than it is to control the voltage of the p-substrate. This is because the p-substrate must be connected to ground voltage in the integrated circuits, while the N-well can be isolated from other voltage sources.

The following U.S. patents and other publications relate to ESD circuits.

1) K. Lee, "Power rail ESD protection circuit," U.S. Pat. No. 5,237,395, 1993.
2) W. Miller, "Electrostatic discharge detection and clamp control circuit," U.S. Pat. No. 5,255,146, 1993.
3) D. Puar, "Shunt circuit for electrostatic discharge protection," U.S. Pat. No. 5,287,241, 1994.
4) C. Duvvury and R. N. Rountree, "Output buffer with improved ESD protection," U.S. Pat. No. 4,855,620, 1989.
5) M. D. Ker, C. Y. Wu, T. Cheng, C. N. Wu, and T. L. Yu, "Capacitor-couple electrostatic discharge protection circuit," U.S. Pat. No. 5,631,793, 1997.
6) C. Duvvury, D. Briggs, J. Rodrigues, F. Carvajal, A. Young, D. Redwine, and M. Smayling, "Efficient npn operation in high voltage NMOSFET for ESD robustness," Tech. Dig. of IEDM, pp. 345–348, 1995.
7) J. Chen, A. Amerasekera, and C. Duvvury, "Design methodology for optimized gate driven ESD protection circuits in submicron CMOS processes," Proc. of EOS/ESD Symp., pp. 230–239, 1997.
8) A. Amerasekera, C. Duvvury, V. Reddy, and M. Rodder, "Substrate triggering and salicide effects on ESD performance and protection circuit design in deep submicron CMOS processes", Tech. Dig. of IEDM, pp. 547–550, 1995.
9) T. Y. Chen, M. D. Ker, and C. Y. Wu, "Experimental investigation on the HBM ESD characteristics of CMOS devices in a 0.35-um silicided process," International Symposium on VLSI Technology, Systems, and Applications, p. 35–38, 1999.

SUMMARY OF THE INVENTION

A principle objective of the invention is to provide new Electrostatic Discharge (ESD) protection circuits containing ESD pulse detection circuits and ESD clamp circuits.

Another objective of the invention is to provide an ESD pulse detection circuit that is formed by a resistor, a capacitor and an inverter that controls the gate of an ESD clamp circuit for efficient turn-on the ESD clamp circuit under conditions of ESD overstress.

Another objective of the invention is to provide an ESD pulse detection circuit that triggers the well of a PMOS device for efficient turn-on of the ESD clamp circuit under conditions of ESD overstress.

Yet another objective of the invention is to provide an ESD pulse detection circuit that efficiently triggers the lateral p-n-p parasitic junction transistor and the vertical p-n-p parasitic junction transistor under conditions of ESD overstress.

A further objective of the invention is to provide an ESD protection circuit that is connected between two terminals of an integrated circuit in order to dissipate an electrostatic charge from an ESD source that is placed in contact with the two terminals thereby preventing damage to the integrated circuit of to which the two terminals are connected.

Yet another objective of the invention is to provide a method for effectively protecting against ESD overstress between power rails.

The present invention provides for a new power-rail ESD clamp circuit with a well-triggered PMOS device. The method of the invention efficiently bypasses the ESD overstress voltage between the VDD and VSS power rails. In accordance with the objectives of the invention, a new ESD (Electrostatic Discharge) protection circuit with well-triggered PMOS is provided for application in power-rail ESD protection. A PMOS device is connected between the VDD and VSS power lines to sustain the ESD overstress current during the time that the ESD voltage is applied between the VDD and the VSS power lines. In deep sub-micron CMOS p-substrate technology, the weak point of ESD overstress control is typically associated with the NMOS device. For this reason, the invention uses a power-rail ESD clamp circuit that incorporates a PMOS device. Applying gate-coupled and N-well triggering techniques, the PMOS can be turned on more efficiently when the ESD overstress is present between the power lines. For p-substrate CMOS technology, it is difficult to couple a high voltage to the substrate of the NMOS device while high voltage is readily coupled to the N-well of a PMOS device. The proposed ESD clamp circuit can be applied efficiently to protect the ESD overstress between power rails.

BRIEF DESCRIPTION OF THE DRAWINGS

FIG. 1 shows a schematic diagram of a Prior Art implementation of a VDD-to-VSS ESD clamp circuit using a NMOS device.

FIG. 2 shows a schematic diagram of a Prior Art implementation of a VDD-to-VSS ESD clamp circuit using a PMOS device.

FIG. 3 shows a schematic diagram of a Prior Art implementation of a VDD-to-VSS ESD clamp circuit using a NMOS device where the implementation is based on using the gate-coupled effect.

FIG. 4 shows a schematic diagram of the implementation of an ESD pulse detection circuit of the invention using a PMOS device.

FIG. 8 shows how the resistance value affects the PMOS the turn-on time,

FIG. 9 shows how the capacitance value affects the PMOS turn-on time,

FIG. 10 shows how the channel width of the PMOS device affects the PMOS turn-on time.

FIG. 11 shows the implementation whereby:
the resistor is implemented using either a poly resistor or a diffusion resistor or a well resistor while the capacitor is provided by either a metal capacitor or a PMOS gate capacitor,
the PMOS gate is connected to the VDD node and is under overstress, an extra NMOS ($M_{N1}$) is added to protect the gate oxide of the MOS gate capacitor.

FIG. 12 shows the implementation whereby:
the resistor is implemented using either a poly resistor or a diffusion resistor or a well resistor while the capacitor are provided by either a metal capacitor or a PMOS gate capacitor.

FIG. 13 shows the implementation whereby:
the resistor is implemented using an active PMOS the capacitor is either a metal capacitor or a PMOS gate capacitor
the PMOS gate is connected to the VDD node and is under overstress, an extra NMOS ($M_{N1}$) is added to protect the gate oxide of the MOS gate capacitor.

FIG. 14 shows the implementation whereby:
the resistor is implemented using an active NMOS
the capacitor is either a metal capacitor or a PMOS gate capacitor.

DESCRIPTION OF THE PREFERRED EMBODIMENTS

Figure 5:
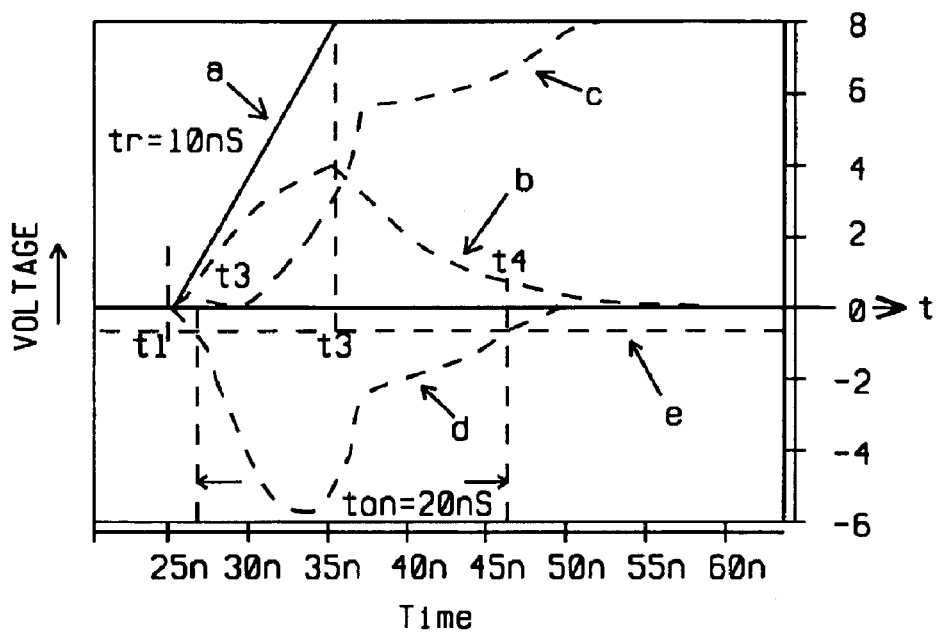
FIG. 5 shows the simulation results of the ESD pulse protection circuit of the invention under conditions of ESD overstress.

The following basic points and aspects that relate to the design of ESD protection circuits deserve to be highlighted:

ESD protection circuits contain two separate functions, that is the function of detecting the presence of an ESD condition and the function of preventing an existing ESD condition from affecting the IC to which ESD protection circuit is dedicated. The first of these two functions is performed by an ESD Detection Circuit, the second function is performed by an ESD Clamp Circuit the ESD detection circuit provides a voltage at the time that an ESD condition exists, this voltage is used to drive or activate the ESD clamp circuit the existence of an ESD condition is monitored on a point of input to an IC, the existence of the ESD condition is monitored with respect to either a low voltage reference point of a ground point. This leads to two points of reference that are normally used for the evaluation of the present of an ESD condition, these two points are frequently referred to as a high voltage reference point or rail VDD and a low voltage reference point or ground VSS for many of the applications of ESD circuits, an inverter is used as the ESD detection circuit, this inverter inverts the ESD voltage and uses the inverted voltage to activate the ESD clamp circuit. In view of the fact that a typical ESD disturbance is a voltage with a fast rise time, the inverter of the ESD detection circuit can be coupled to the ESD disturbance via a capacitor that provides a low resistivity connection between the ESD voltage and the inverter for a fast rising ESD voltage. Under those conditions of circuit design, a resistor is typically connected between the input of the inverter and the ground point of reference in order to establish the desired voltage operating conditions for the inverter an ESD clamp circuit can be created using either a PMOS or a NMOS device, the gate of these devices is typically connected to the output of the inverter whereby the inverted, detected ESD voltage is supplied to the gate of the PMOS or NMOS device of importance to the design of the ESD clamp circuit is the concept of parasitic transistors that are present internally to the MOS device that is used for the ESD clamp circuit. MOS devices are fundamentally created by impurity implants into the surface of a silicon substrate on a surface of which a gate electrode for a MOS device is being created. These implants form for instance the source and drain regions, as a first step in the creation of MOS devices a p-well or n-well conductivity region is created in the surface of the substrate whereby the n-well or p-well underlies and contains the complete pattern of functionally cooperating MOS devices. These impurity implants lead to the formation of junctions between the various regions of different conductivity such as between source/drain and n-well/p-well and further between the n-well/p-well and the underlying silicon substrate that also is of a particular impurity and subsequent conductivity. These junctions lead to the formation of parasitic transistors. Where these parasitic transistors extend in the direction of the surface of the substrate, these transistors are referred to as lateral parasitic transistors. Where these transistors penetrate into the surface of the transistor in the direction of the underlying substrate, these transistors are referred to as vertical parasitic transistors. The design of most ESD clamp circuits makes use of these transistors, these transistors are under certain conditions of operation of the ESD clamp circuit triggered thereby short-circuiting the ESD voltage before this voltage can reach the IC. Examples of these parasitic capacitors have been highlighted in FIGS. 19, 20, 22, and 23 contained herein wherein Q1 are lateral parasitic transistors and Q2 are vertical parasitic transistors. For the specific application that has been highlighted in these referenced figures, the transistor Q1 is a lateral parasitic p-n-p junction transistor while transistor Q2 is a vertical parasitic p-n-p junction transistor. The action of turning on these transistors forms the heart of the function of the ESD clamp circuit as will be explained in detail in the text that follows a point that is of importance to the application of MOS devices as provided by this patent makes use of the fact that when using a p-type silicon substrate into the surface of which an n-well is formed, the voltage of the n-well can be better controlled than the voltage of the underlying p-type substrate. This is because the p-type substrate inherently contains a substrate resistance through which a path of conductivity as yet remains for a significant portion of the body of the substrate. This as opposed to the n-well that can readily be isolated from other, surrounding voltage levels without any paths of resistivity between the n-well and its surroundings it must, as part of the design and evaluation of ESD protection circuits, be determined how these circuits perform under conditions of ESD presence (ESD stress) and under normal operating conditions. Under the former operational condition, the ESD circuits must perform their function of protecting the IC, under the latter conditions the ESD circuits must not affect the IC.

Figure 19:
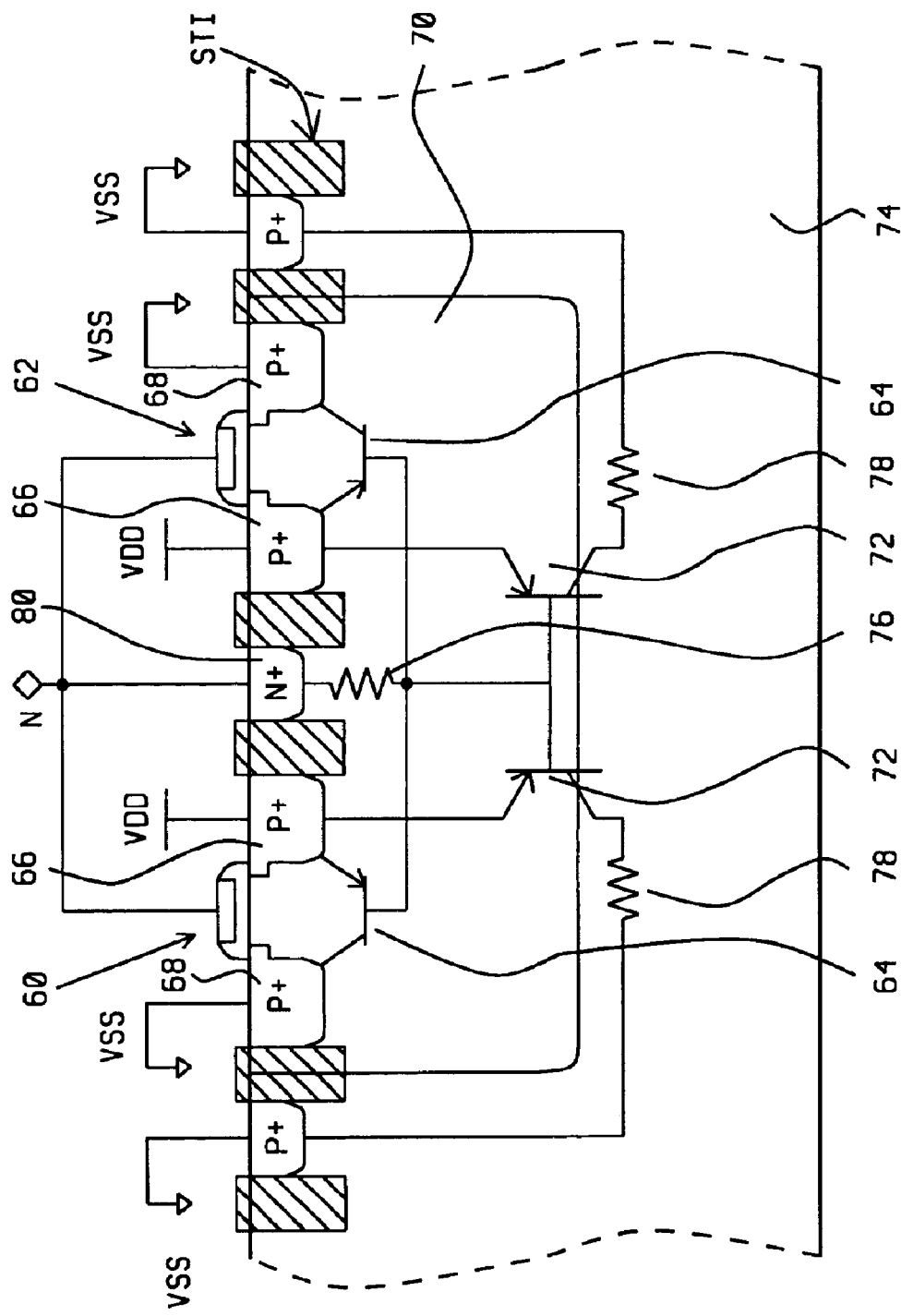
FIGS. 19 and 20 show cross sectional views of two different device structures of device implementations in accordance with the circuit diagrams that have been shown in FIG. 15.
Figure 20:
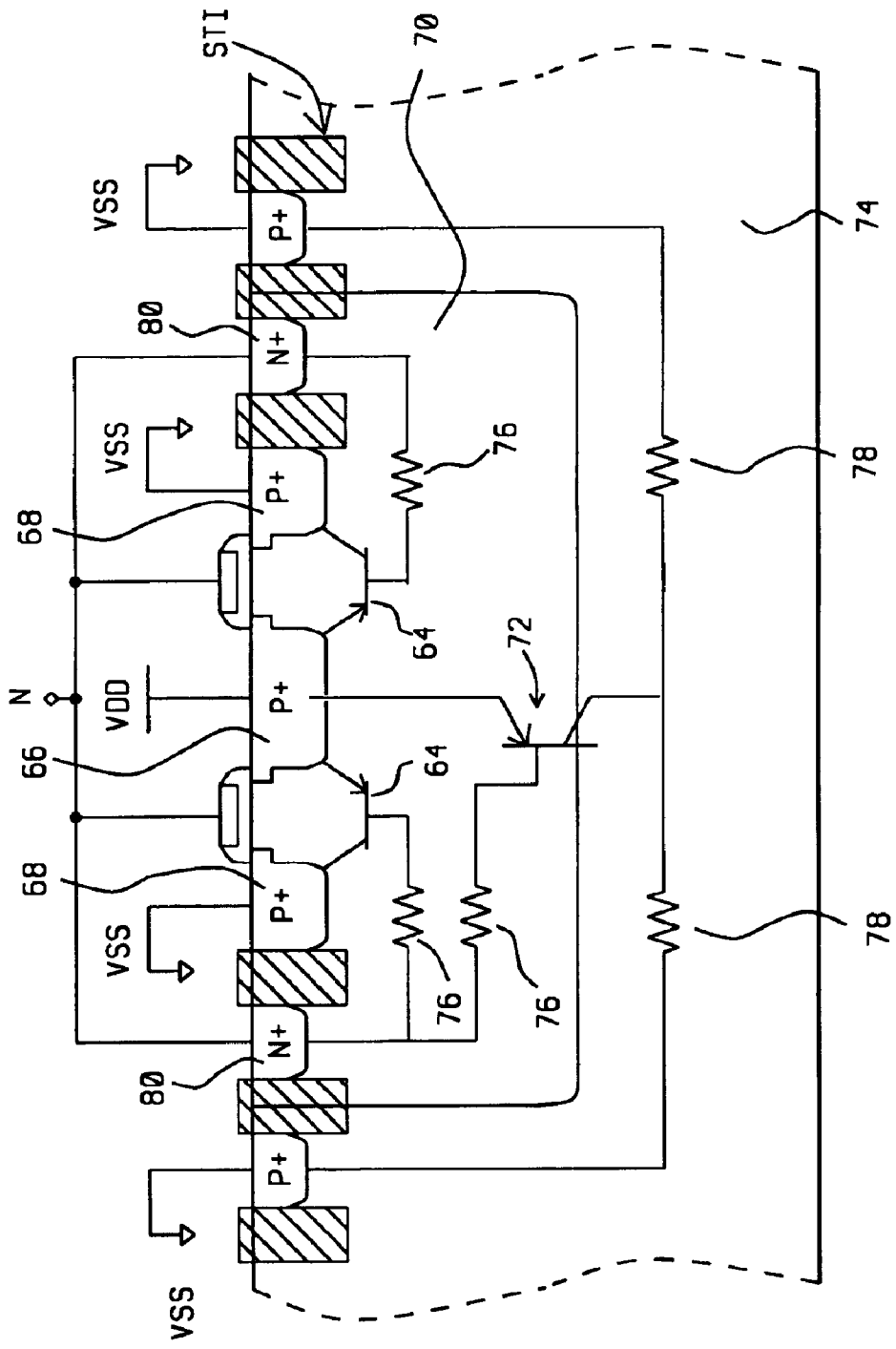
Figure 21:
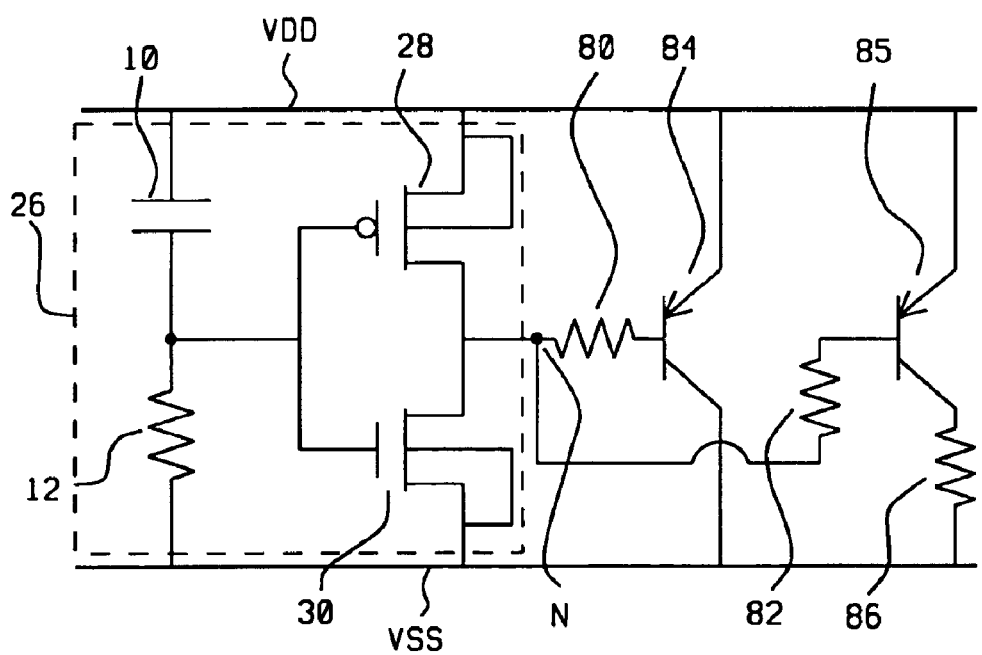
FIG. 21 shows a circuit diagram whereby the well-triggered PMOS ESD clamp has been extended to the well-triggered pnp BJT ESD clamp circuit.
Figure 22:
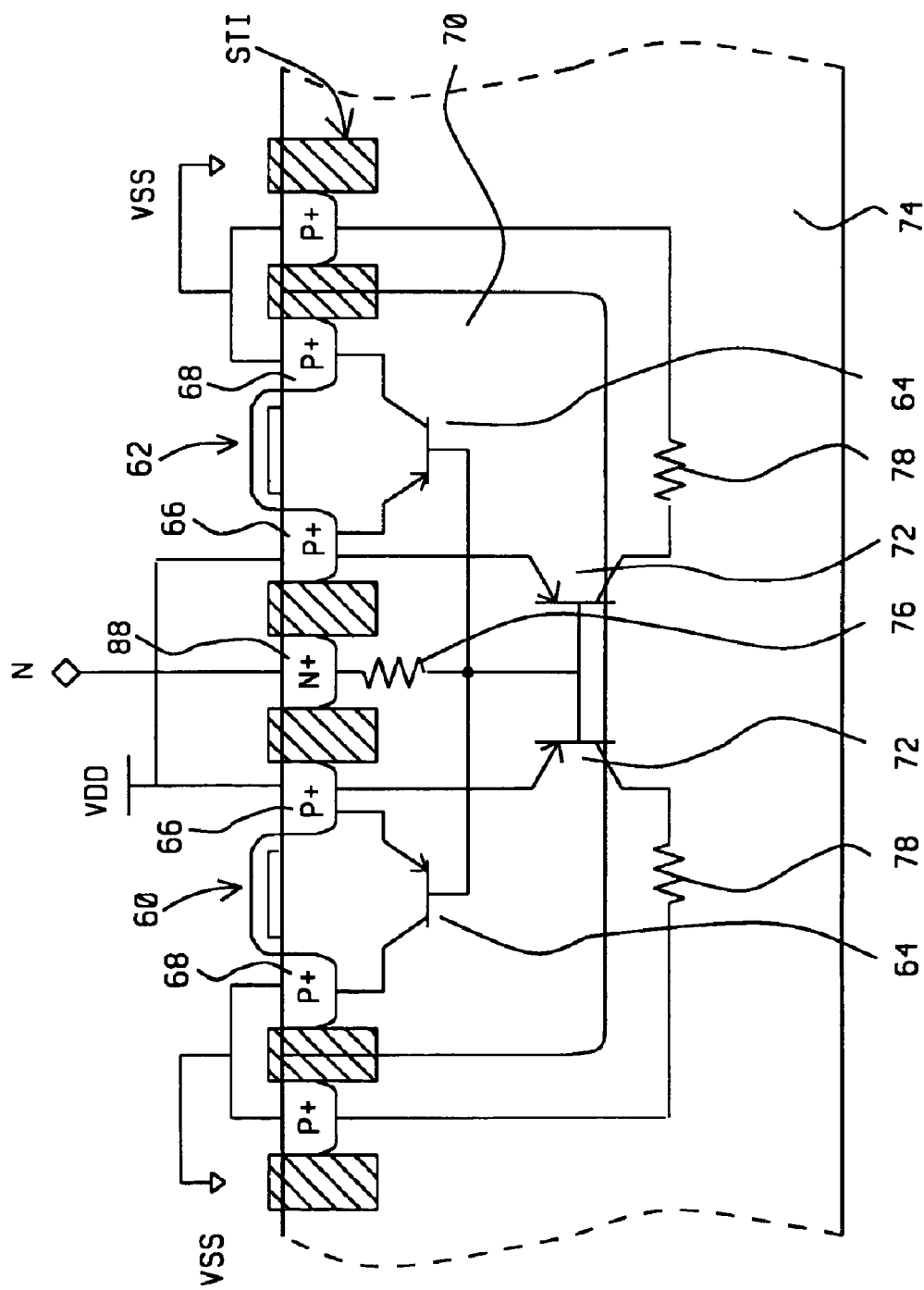
FIGS. 22 and 23 show two device cross-sectional views of the circuits of the invention that are shown in FIG. 21.
Figure 23:
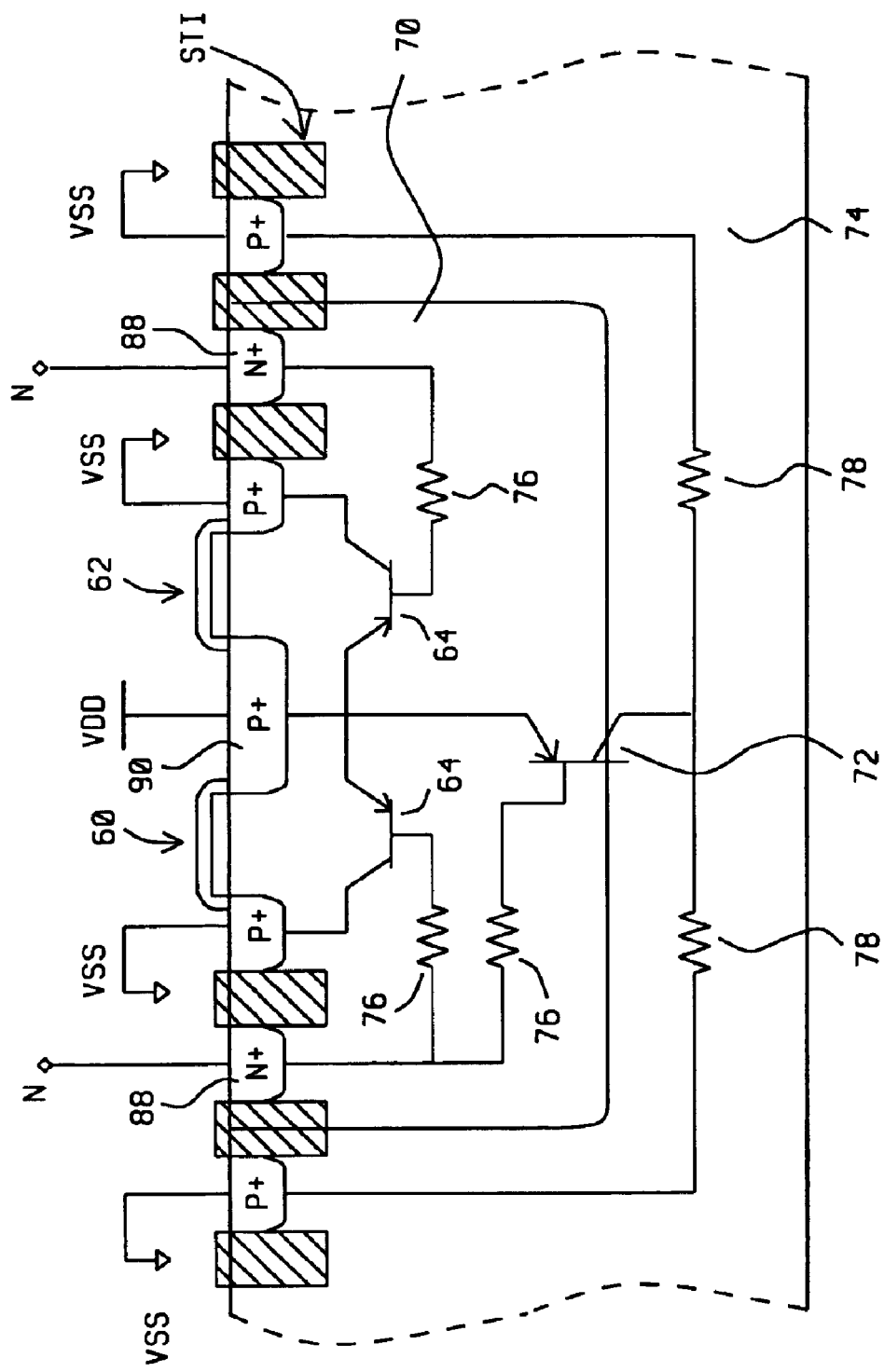

The following discussion highlights circuit diagrams and simulation results that have been obtained within the context of the invention. The material presented addresses in sequence:

the circuit diagram of the ESD detection and ESD clamp circuits of the invention with a detailed explanation of their operation (FIG. 4)

simulation results as they relate to the circuits of the ESD detection and ESD clamp circuit of the invention (FIGS. 5 through 10)

various circuit implementations of the ESD circuits of the invention (FIGS. 11 through 14)

a power-rail well-triggered PMOS ESD clamp circuit of the invention (FIGS. 15 through 18)

two cross sections and a discussion of two methods of implementation of the power-rail well-triggered PMOS ESD clamp circuit of the invention (FIGS. 19 and 20)

an extension of the power-rail well-triggered PMOS ESD clamp circuit of the invention by making this circuit into a well-triggered p-n-p parasitic transistor triggered device (FIG. 21)

two cross-sections and a discussion of two methods of implementation of the latter device (FIGS. 22 and 23).

The invention of a power-rail ESD clamp circuit contains an ESD pulse detection circuit and an ESD clamp PMOS device, these components are arranged in a circuit diagram that is shown in FIG. 4.

The ESD pulse detection circuit 26 is formed by a capacitor 10, a resistor 12, and an inverter, where the inverter is formed by the PMOS device (28) $M_P$ and the NMOS device (30) $M_N$. The function of the ESD pulse detection circuit is to detect the ESD pulse, which occurs between the highlighted VDD and VSS power rails. The ESD clamp $M_{ESD}$ (32) that is formed by the PMOS device will be turned on by the ESD pulse detection circuit 26 at the time that the ESD pulse is detected. In the absence of the ESD pulse $M_{ESD}$ will remain turned off.

At the time that an ESD overstress voltage occurs between the VDD and VSS power rails, the voltage at node Ni is coupled to the high voltage VDD via the capacitor C (10). The voltage at node N is forced to a low voltage value by the inverter, which is made up of $M_P$ (28) and $M_N$ (30). Therefore the ESD clamp $M_{ESD}$ (32) containing a PMOS device will be turned on to bypass the ESD current. The RC network is used to turn off $M_{ESD}$ in normal operation that is when VDD is biased at 3.3V. Under normal operating conditions, the voltage at node Ni is 0 volts while the voltage at node N is equal to VDD due to the inverter. Therefore, the ESD clamp $M_{ESD}$ using a PMOS device is turned off under normal operating condition.

The phenomenon described above can be simulated by using circuit simulators. For this purpose the ESD protection circuit of the invention, which is shown in FIG. 4, has been designed using a 0.25 μm logic salicide process. The simulator that has been used for this purpose is a simulator known as Hspice. The W/L Of $M_{ESD}$ in the circuit of the invention has a channel width of 30 μm and a channel length of 0.5 μm for each finger of $M_{ESD}$. There are a total of 10 fingers for $M_{ESD}$ resulting in a total channel width of 300 μm. The W/L of $M_P$ of the inverter has a channel width of 25 μm and a channel length of 0.35 μm. The W/L of $M_N$ of the inverter has a channel width of 10 μm and a channel length of 0.35 μm. The value of resistance R is 12 Kohm while the value of the capacitance C is 0.5 pF. Simulations under two different operating conditions are required in order to verify the functioning of the circuit of the invention. The first operating conditions represent the ESD overstress conditions where ESD overstress is between the VDD and VSS power rails. The second operating conditions represent the power-on conditions where a voltage of 3.3 Volts exists between the VDD and VSS power rails.

The operation of the proposed ESD protection circuit when ESD voltage exists between the VDD and VSS power rails can be explained as follows. The ESD overstress voltage with an amplitude of 8 volts and a rise time of 10 nS is applied between the VDD and VSS power rails. Because the junction breakdown voltage of the PMOS device 32 (FIG. 4) is about 9.5V, $M_{ESD}$ must be turned on before conditions of junction breakdown occur. Otherwise, the ESD pulse detection circuit is of no help in triggering (switching on) $M_{ESD}$, as a consequence, the ESD level will not be improved. When the voltage at VDD is increased, this voltage is coupled to Ni via capacitor C. After the voltage at Ni is above a threshold voltage of $M_N$, the NMOS device of the inverter will turn on and clamp the voltage at N to a low voltage level. Under these conditions, the voltage between node N and VDD (FIG. 4), Vgs, decreases from 0 volts to a negative voltage. Whenever the value of Vgs is less than the threshold voltage of $M_{ESD}$, $M_{ESD}$ will be turned-on. The threshold voltage of $M_{ESD}$, which is referred to as Vthp, is about −0.86 volts in the circuit shown in FIG. 4.

The simulation results of the proposed ESD protection circuit under conditions of ESD overstress (FIG. 4) are shown in FIG. 5. The various curves that are shown in FIG. 5 show the values over time of the following voltages:

curve a: VDD
curve b: Vgi
curve c: Vg
curve d: Vgs
curve e: Vthp.

The voltages at the nodes of VDD, N, Ni, and the value of Vgs are plotted in this figure. The voltage at the nodes VDD, N, and Ni are referred to as V(VDD), Vg, and Vgi, respectively. The turn-on threshold voltage of $M_{ESD}$, Vthp, is also plotted in this figure as an illustration of the turn-on time of $M_{ESD}$, which is referred to as $t_{on}$. In this $t_{on}$ is the length of the time period when $M_{ESD}$ is turned-on. The value of $t_{on}$ is important to the ESD level of the ESD clamp circuit of the invention. Typically, an appropriate value for $t_{on}$ is 20 nsec.

FIG. 5 highlights the time period when the voltage at VDD is increasing from 0 volt to 8 volt. This time period begins at the time $t_1$ and ends at $t_2$. When the voltage at VDD is increasing, the value of Vgi is also increasing due to the coupling effect of C. After Vgi is above the threshold voltage of $M_N$, $M_N$ is turned on and the value of Vg is decreasing. Under these conditions, the value of Vgs is decreasing and $M_{ESD}$ is turned on at time $t_3$ when the value of Vgs is less than Vthp. After some time between $t_1$ and $t_2$, the value of Vg is increasing instead of decreasing due to the turn-on of the PMOS device, $M_P$, in the inverter. However, the value of Vgs is also decreasing in this period. After the time $t_2$ the voltage at VDD remains at 8V. In this period, the value of Vgi is decreasing due to the effect of the RC time constant. At the same time, the value of Vg is increasing and the value of Vgs is decreasing. Finally, $M_{ESD}$ is turned off after the time of $t_4$. The time period between $t_3$ and $t_4$ is referred to as $t_{ON}$. For the simulation under discussion, the value of $t_{ON}$ is equal to about 20 nsec.

Figure 6:
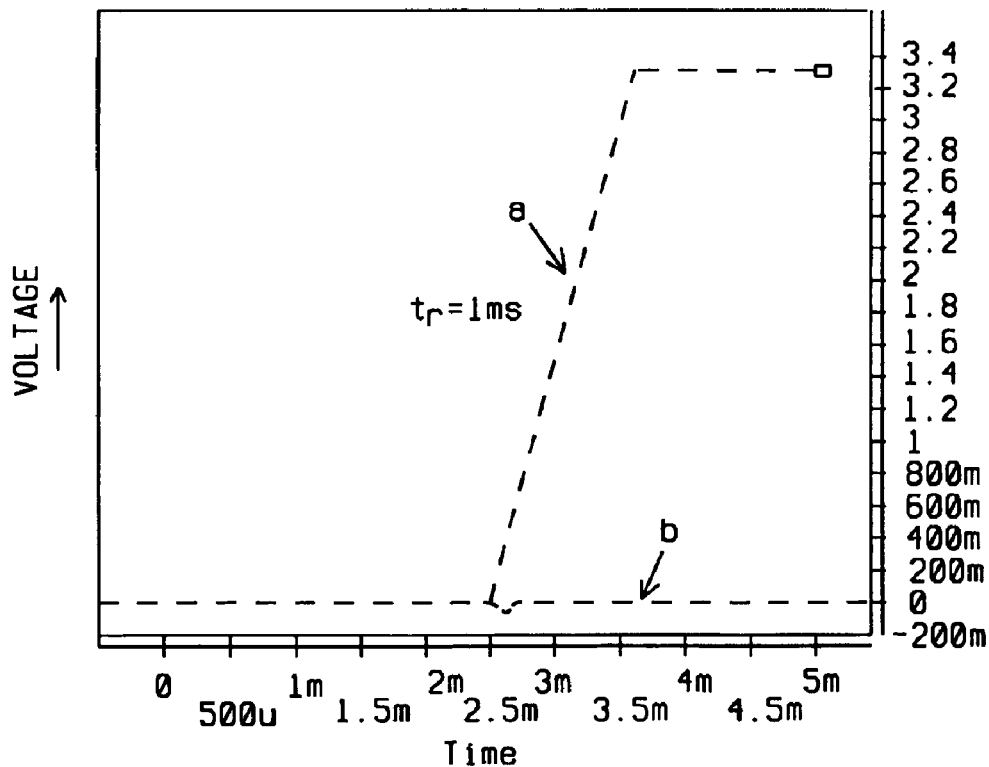
FIG. 6 shows a graphic plot of values of VDD and Vgs for the entire simulation period.
Figure 7:
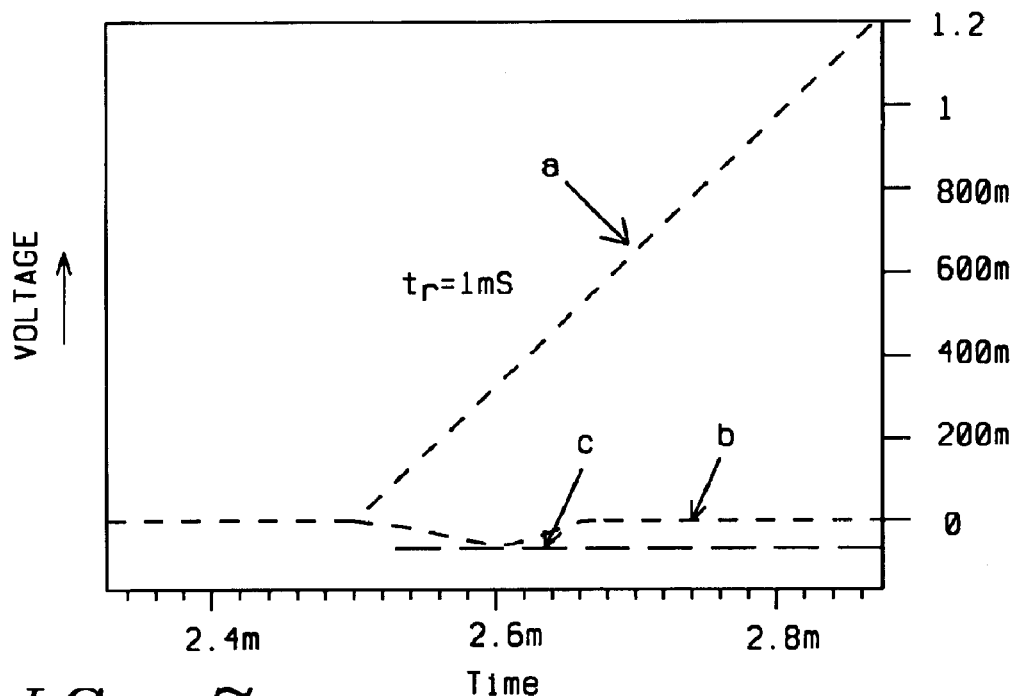
FIG. 7 shows a graphic plot wherein the simulation results that have been shown in FIG. 6 are further magnified in order to show the maximum value of Vgs.

To verify the operating mechanism of the ESD pulse detection circuit under normal conditions of power-on operation, the power-on condition have been simulated in order to verify that the ESD pulse detection circuit works to satisfaction in keeping the ESD clamp PMOS device turned off. Under this simulation, the power-on ramp had a magnitude of 3.3V and a rise time of 1 msec. and is applied between the VDD and VSS power rails. It needed to be confirmed that the value of Vgs would not fall below the PMOS device threshold voltage, Vthp. The simulation results are shown in FIG. 6 and FIG. 7. In FIG. 6, the voltage at VDD (curve a) and the value of Vgs (curve b) for the entire simulation period are shown. It can readily be verified that the value of Vgs that is coupled from the VDD node is small. The simulation results of FIG. 6 have further been magnified to measure the peak value of the Vgs as shown in FIG. 7.

The various curves that are shown in FIG. 7 show the values over time of the following voltages:

curve a: VDD
curve b: Vgs
curve c: a voltage level of −0.059 volts.

The peak value of Vgs is −0.059 volts, while the absolute value of Vgs is much smaller than the absolute value of Vthp, that is 0.86V. Therefore, this confirms that the ESD clamp using the PMOS device will not be turned on under normal power-on condition. Because the rise time of the power-on ramp is very long compared to that of an ESD pulse, the ESD pulse detection circuit can detect an ESD pulse while not being influenced by the power-on ramp. Therefore, the ESD pulse detection circuit will turn on $M_{ESD}$ under ESD overstress conditions and turn off $M_{ESD}$ under power-on conditions. It must further be emphasized that, when the voltages at VDD and VSS are 3.3 volts and 0 volt, respectively, the RC network will force the voltage at node Ni to 0 volt while the voltage at node N equals 3.3 volts. Therefore, $M_{ESD}$ is turned off under normal operating conditions.

The value of $t_{on}$ is important to the ESD performance of the invention. If this value is too small, there is nearly no effect on the triggering on of the $M_{ESD}$. Under these conditions, the ESD performance will not be improved by this ESD pulse detection circuit. If the value of $t_{on}$ is too large, a major portion of the ESD current will pass through the surface channel of $M_{ESD}$ and may cause damage at the surface channel of MED. Under these conditions, $M_{ESD}$ must be rugged enough to sustain the large ESD current. Otherwise, the ESD performance will be degraded due to damage at the surface channel of $M_{ESD}$. Therefore, it is very important to understand the effects that the parameters of the ESD pulse detection circuit have, this will be explored following.

Figure 8:
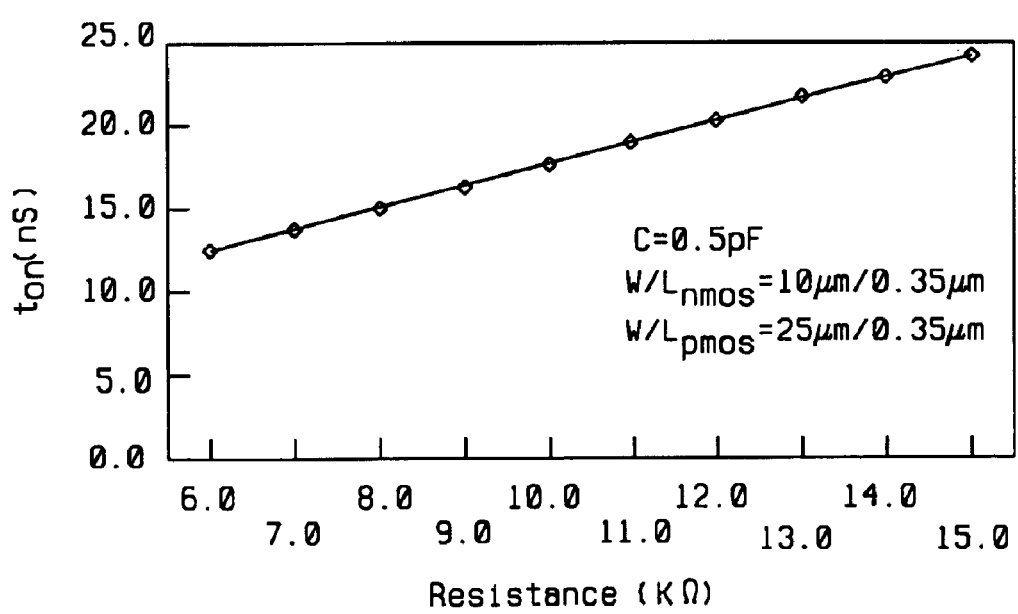
FIGS. 8 through 10 show simulation results that have focused on the relationship between the performance of the ESD pulse detection circuit and the circuit parameters, as follows.
Figure 9:
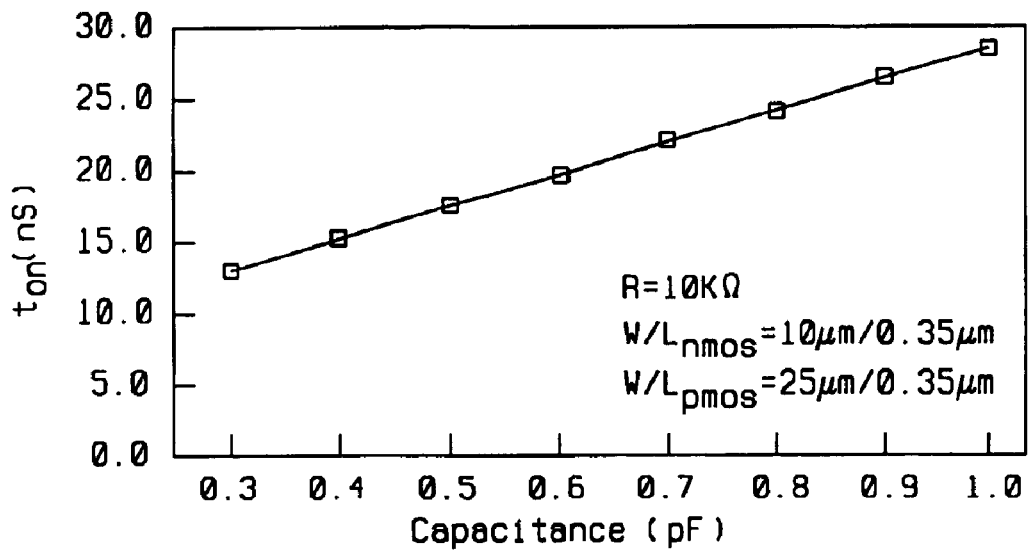
Figure 10:
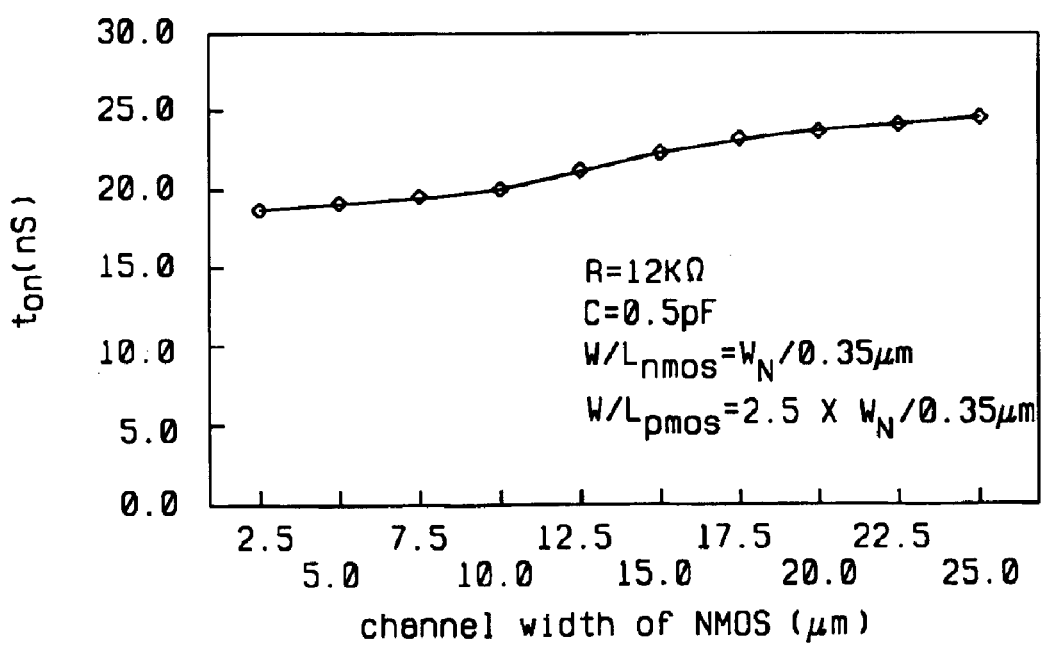

In order to understand the relationship between the performance of the ESD pulse detection circuit and the circuit parameters, the PMOS turn-on time $t_{on}$ has been simulated versus the resistance, the capacitance, and the W/L of the inverter. These simulation results are plotted in FIG. 8, FIG. 9 and FIG. 10 for respectively resistance value, capacitance value and the channel width of an inverter. The channel width of an inverter means the channel width of $M_N$ of the inverter. The channel width of $M_P$ of the inverter is designed as 2.5 times of the channel width of $M_N$ of the inverter. The channel lengths of $M_P$ and $M_N$ are both 0.35 um. In FIG. 8, the resistor values range from 6.0 Kohm to 15.0 Kohm with a fixed value for the capacitance C=0.5 pF. The W/L of $M_P$ and $M_N$ is equal to 25.0 um/0.35 um and 10 um/0.35 um, respectively. In FIG. 9, the capacitor values range from 0.3 pF to 1.0 pF with a fixed value for R=10 Kohm, and W/L of $M_P$ and $M_N$ equal 25.0 um/0.35 um and 10 um/0.35 um, respectively. In FIG. 10, the channel width of $M_N$, which is referred to as $W_N$, ranges from 2.5 um to 25.0 um with fixed values of R=12 Kohm, C=0.5 pF, L of $M_N$ equals 0.35 um and W/L of $M_P$ equals 2.5×$W_N$/0.35 um. From these three figures, it has been found that $t_{on}$ is increasing when the resistance value, the capacitance value, and the value of $W_N$ are increasing. Therefore, in the design of this ESD pulse detection circuit, we can appropriately design the values of the resistance, capacitance, and $W_N$ in order to create an area-efficient ESD protection circuit.

Next will be discussed Circuit Implementations of the invention for ESD Protection. There are several circuit implementations of the ESD pulse detection circuit of the invention, especially relating to the implementation of the resistor R (12 in FIG. 4) and the capacitor C (26 in FIG. 4).

Circuit implementations of the invention are demonstrated in FIG. 11 through FIG. 14.

Among these figures, the resistor R (12 in FIGS. 11 and 12) can be implemented as a poly resistor, a diffusion resistor or a well resistor. These respective implementations are plotted in FIG. 11 and FIG. 12. The resistor can also be implemented by an active PMOS device or an active NMOS device, this is shown in FIG. 13 and FIG. 14 respectively as follows: 34 in FIG. 13 is the active PMOS device with resistive gate load resistance 36 connected between the gate of PMOS device 34 and the voltage VSS, 38 in FIG. 14 is the active NMOS device with resistive gate load resistance 40 connected between the gate of NMOS device 38 and the voltage VDD.

Figure 11:
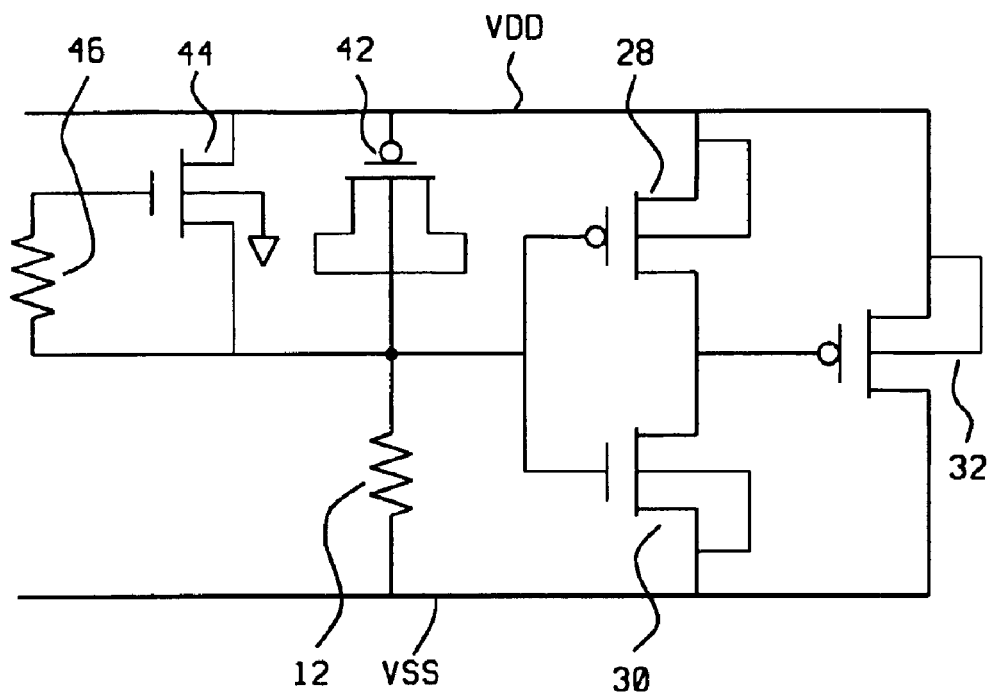
FIGS. 11 through 14 show circuit implementations of the circuit of the invention, as follows.
Figure 12:
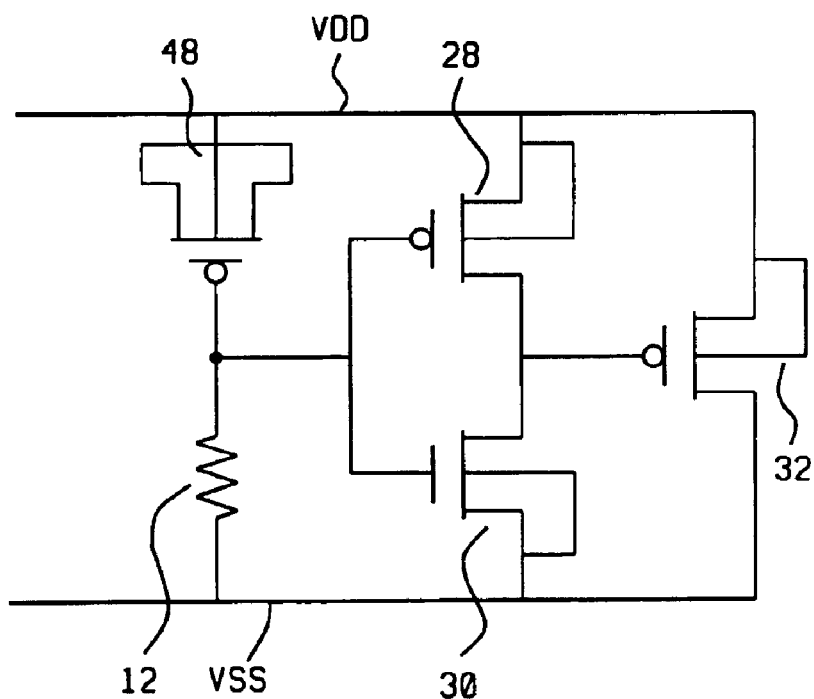
Figure 13:
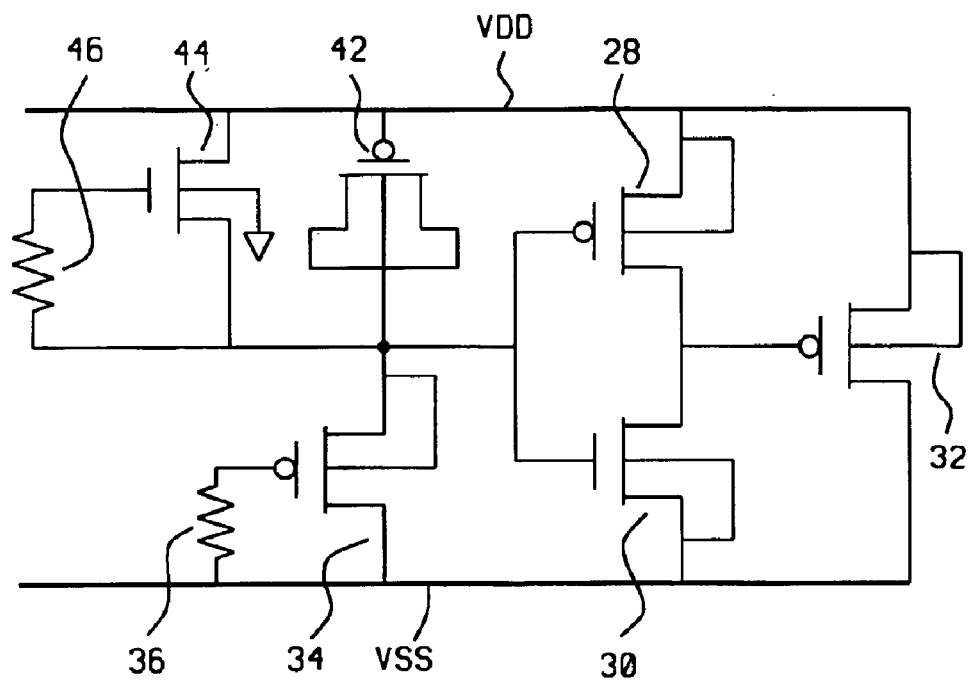

The capacitor C (10, FIG. 4) can be implemented by metal capacitor or by a MOS gate capacitor, this is shown in FIG. 11 through FIG. 14. FIGS. 11 and 13 show how the capacitor is formed by using a MOS gate 42 whereby the MOS gate 42 is connected to the VDD node and is under overstress of the ESD voltage. An extra NMOS device ($M_{N1}$, 44) is added to protect the gate oxide of the MOS gate 42 capacitor Mc, resistor 46 is the biasing resistor for the MOS gate 44.

Figure 14:
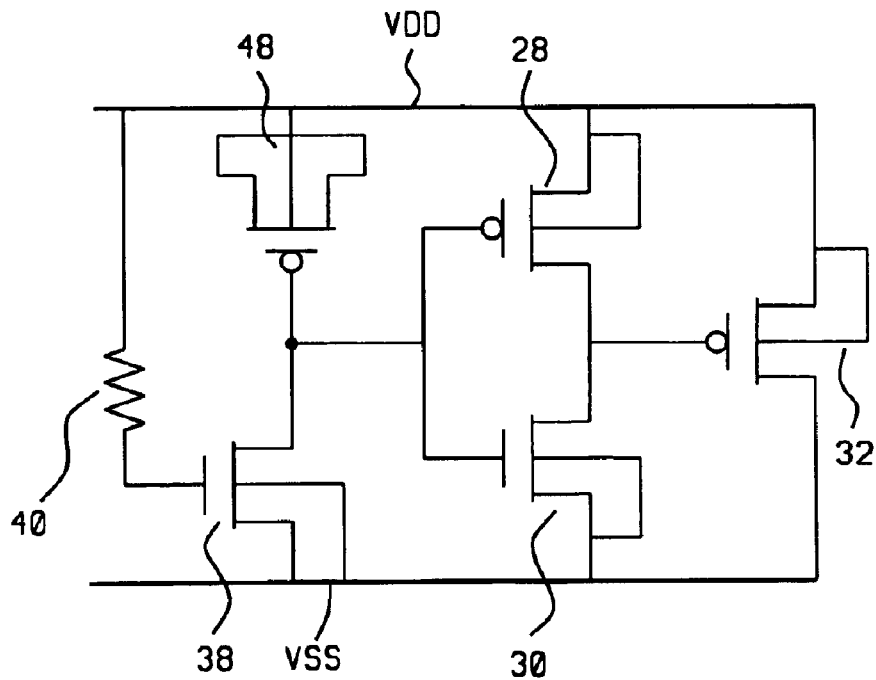

FIG. 12 and FIG. 14 show implementations whereby the capacitor is a MOS gate 48 capacitor, the bulk of the MOS gate 48 is connected to the VDD voltage (the power rail).

The following table shows the various implementation alternatives that have been used in the above FIGS. 11 through 14.

| FIG. # | R | C | MOS Gate Conn. |
|---|---|---|---|
| 11 | poly, or diff. res., or well res. | metal, or MOS gate | VDD node w. NMOS protect. |
| 12 | poly, or diff. res., or well res. | metal MOS gate | node Ni |
| 13 | active PMOS | metal MOS gate | VDD node w. NMOS protect. |
| 14 | active NMOS | metal MOS gate | node Ni |

The following paragraphs further discuss the application of a Power-Rail Well-Triggered PMOS device for ESD Protection in accordance with the methods of the invention.

The schematic diagrams and circuit implementations of the well-triggered PMOS ESD clamp circuits are shown in FIGS. 15 through 20.

Figure 15:
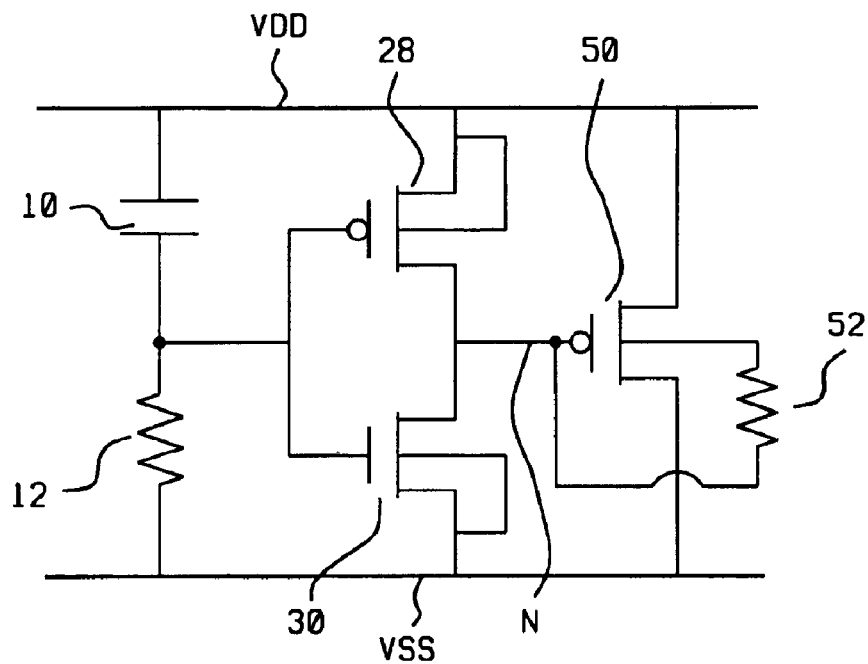
FIG. 15 shows a diagram of a circuit of the invention using a well-triggered PMOS ESD clamp circuit that is combined with the gate-coupled technique.

FIG. 15 shows a well-triggered PMOS ESD clamp circuit that is combined with gate-coupled technique. $M_{ESD}$ device 50 is the PMOS ESD clamp circuit. The ESD pulse detection circuit is formed to control the voltage at node N and thus the turn-on conditions of $M_{ESD}$. The turn-on mechanism of the $M_{ESD}$ is controlled by the voltages at the gate and the bulk of $M_{ESD}$. It had been demonstrated that the ESD level of $M_{ESD}$ can be improved using this technique. In FIG. 15, the voltage at the bulk of the $M_{ESD}$ i.e. the N-well in the p-substrate CMOS process, is driven by the node N, through the pick-up contact of the N-well. Rw (52) in FIG. 15 is the N-well resistance of this implementation.

Figure 16:
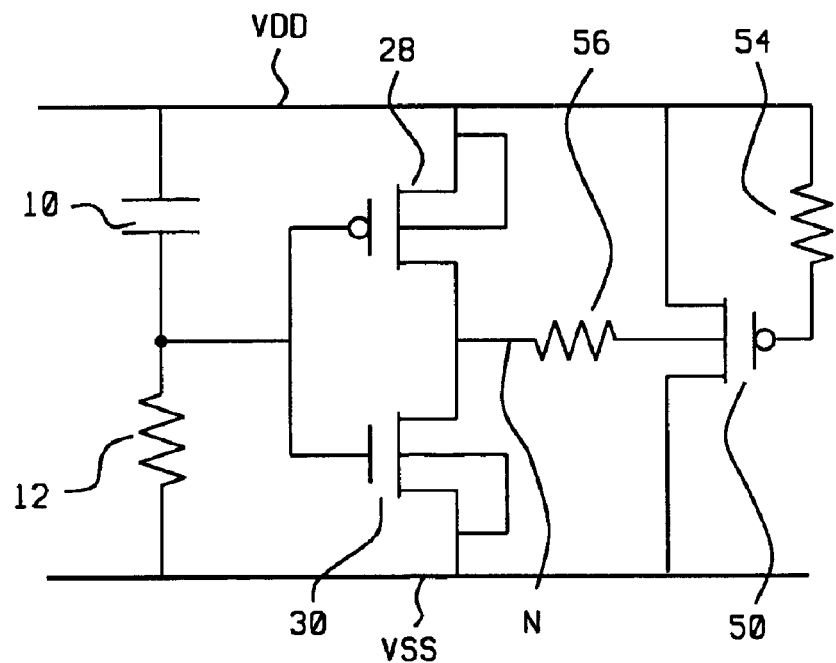
FIG. 16 shows a diagram of a circuit of the invention using a well-triggered PMOS ESD clamp circuit whereby the gate of the PMOS device is connected to the VDD node through a resistor $R_g$.

FIG. 16 shows how the ESD protection circuit of the invention can be implemented by the well-triggered PMOS and by connecting the gate of the PMOS device to the VDD node through a resistor Rg (54). The ESD clamp PMOS device 50 in FIG. 16 is termed as $M_{ESD}$ whereby the well resistance of the PMOS device 50 is represented by resistance 56. Rg (54) is used to prevent the gate oxide breakdown of $M_{ESD}$ due to the ESD overstress on the VDD node.

Figure 17:
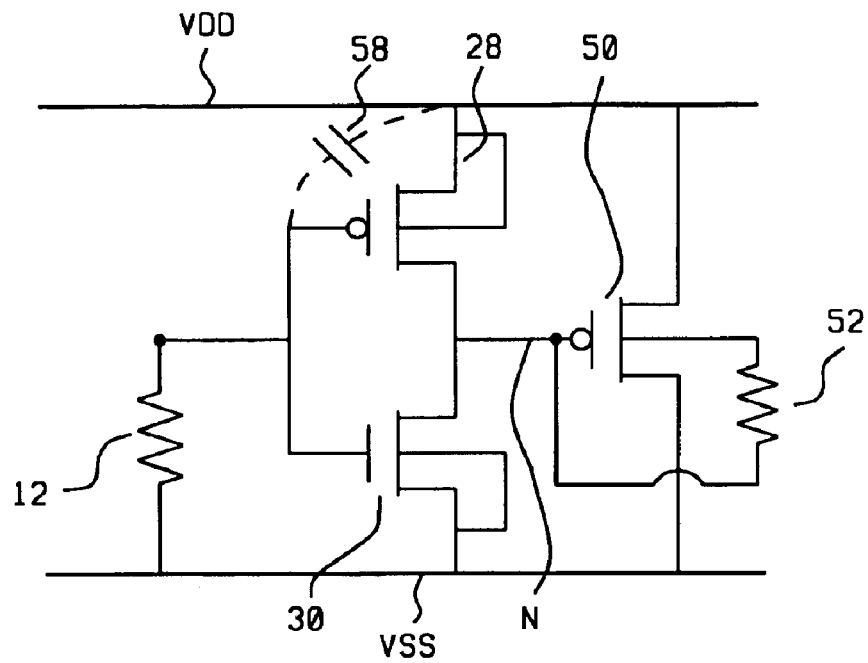
FIG. 17 shows a diagram of a circuit of the invention using a well-triggered PMOS ESD clamp circuit whereby the capacitor C of FIGS. 15 and 16 is replaced by a parasitic capacitor between the gate and the drain of the $M_P$ using the well-triggered combined with gate-coupled techniques.
Figure 18:
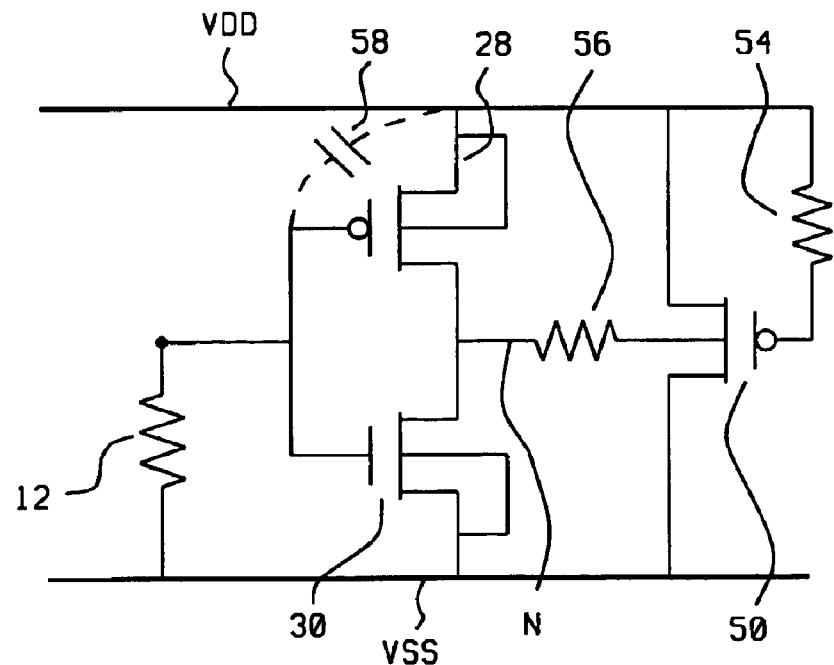
FIG. 18 shows a diagram of a circuit of the invention using a well-triggered PMOS ESD clamp circuit whereby the capacitor C of FIGS. 15 and 16 is replaced by a parasitic capacitor between the gate and the drain of the $M_P$ using the well-triggered technique only.

In order to reduce the required layout area of the implementation, the capacitor, C (10) shown in FIG. 15 and FIG. 16, can be replaced with the parasitic capacitor between the gate and drain of the $M_P$. The parasitic capacitor is termed as Cgd and is shown as capacitor 58 in FIG. 17 and FIG. 18. FIG. 17 is the well-triggered application that is combined with gate-coupled techniques, while FIG. 18 is the well-triggered technique. For these applications, the resistance value of the resistor R (12) must be large enough to compensate for the small value of Cgd (58) such that the turn-on time, $t_{on}$, of the circuit is acceptable. These design parameters can be designed by means of circuit simulation.

FIG. 19 and FIG. 20 show cross-sectional views of two different device structures of PMOS devices implemented in accordance with the circuit configuration that is shown in FIG. 15. In these figures, the device structures of two symmetric ESD clamp PMOS devices (60 and 62) as well as the parasitic devices and resistors are shown. Q1 (64) is the parasitic lateral p-n-p BJT, which is formed by the drain junction 66 of the PMOS devices 60 and 62, the N-well 70 and the source junction 68 of the PMOS devices 60 and 62. Q2 (72) is the parasitic vertical p-n-p BJT, which is formed by the drain junction 66 of the PMOS devices 60 and 62, the N-well 70 and the p-substrate 74. Rw (76) is the resistor formed by the N-well 70 and Rsub 78 is the resistor formed by the p-substrate. In FIG. 19, the two ESD clamp PMOS devices 60 and 62 are placed separately by inserting the N-well pick-up contact 80 between them. The N-well pick-up contact 80 is connected to the node N. In FIG. 20, the drain sides 66 of the two ESD clamp PMOS devices 60 and 62 are connected together and the N-well pick-up contacts 80 are placed around these PMOS devices.

Next will be discussed Well-Triggered p-n-p devices of the invention that are applied for ESD Protection in accordance with the methods of the invention.

The well-triggered PMOS ESD clamp circuit can be extended to the well-triggered p-n-p BJT ESD clamp circuit. The schematic diagram of this invention is shown in FIG. 21. Rw1 (80) and Rw2 (82) are the N-well resistors connected between the N-well pick-up contact and the base of the p-n-p' junctions. Q1 (84) is the lateral p-n-p BJT formed under the field oxide by P+ diffusion region, N-well and P+ diffusion region. Q2 (85) is the vertical p-n-p BJT formed by P+ diffusion region, N-well and the P-substrate. Rsub (86) is the resistor formed by the resistance of the P-substrate. When the ESD overstress voltage exists between the VDD and the VSS power rails, the ESD pulse detection circuit will force the voltage at node N to a low voltage value, thus triggering Q1 (84) and Q2 (85) on thereby bypassing the ESD current. Under normal power-on operation, the voltage at node N will remain high and at a value of VDD. The transistors Q1 (84) and Q2 (85) are therefore turned-off under the normal operating conditions.

Two possible layout implementations of this invention are shown in FIG. 22 and FIG. 23. In these figures, two symmetric devices are drawn for illustration purposes. In FIG. 22, these two devices are separately by the N-well pick-up contact 88. The N-well pick-up contact 88 is connected to the node N. In FIG. 23, the P+ diffusion regions of the two PNP devices 60 and 62 are merged together to form one single P+ diffusion region 90. This merged P+ diffusion region 90 is connected to the VDD node. The N-well pick-up contacts 88 are placed around the ESD clamp devices. By appropriate design of the ESD pulse detection circuit, the invention can be applied as an efficient power-rail ESD clamp circuit between VDD and VSS power rails.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. An Electrostatic Discharge (ESD) protection circuit that is connected between a first terminal and a second terminal of an Integrated Circuit (IC), whereby said ESD protection circuit has an objective to dissipate an electrostatic pulse that originates from an ESD source that is connected between said first terminal and said second terminal thereby protecting said IC from potential damage that can be caused by exposure of said IC to extreme values of voltage from said ESD source, whereby said ESD protection circuit comprises:

an ESD pulse clamp means comprising a PMOS device for shunting said electrostatic pulse from said IC having a first port that is connected to said first terminal of said IC, a second port that is connected to said second terminal of said IC, and a third port; and an ESD pulse detection means having a first input port connected to said first terminal of said IC, a second input port connected to said second terminal of said IC, an output port that is connected to said third port of said ESD pulse clamp means, wherein said ESD pulse detection means comprises a voltage inverter directly controlling a gate electrode of said PMOS device, whereby in detecting a presence of said electrostatic pulse said ESD pulse detection means generates a voltage that triggers said ESD pulse clamp means thereby shunting said electrostatic pulse from said IC.

2. The circuit of claim 1 wherein said ESD pulse detection means contains a network comprising a resistive component having a first and a second terminal, a capacitive component having a first and a second terminal, and said voltage inverter.

3. The circuit of claim 2 wherein said voltage inverter comprises a PMOS device having connections of gate electrode, source, drain and bulk, and a NMOS device having connections of gate electrode, source, drain and bulk, whereby said voltage inverter contains a first port, a second port, a third port, and a fourth port.

4. The circuit of claim 3 wherein said first port of said voltage inverter is connected to said first terminal of said IC, while said second port of said voltage inverter is connected to said second terminal of said IC.

5. The circuit of claim 3 wherein said connections of gate of said PMOS device and of said NMOS device are commonly connected to said third port of said voltage inverter.

6. The circuit of claim 3 wherein said connection of drain and said connection of bulk of said PMOS device are commonly connected to said first port of said voltage inverter.

7. The circuit of claim 3 wherein said connection of source and said connection of bulk of said NMOS device are commonly connected to said second port of said voltage inverter.

8. The circuit of claim 3 wherein said connection of source of said PMOS device and said connection of drain of said NMOS device are commonly connected to said fourth port of said voltage inverter.

9. The circuit of clam 2 wherein said capacitive component has a first terminal and a second terminal, said first terminal of said capacitive component is connected to said first terminal of said IC, said resistive component has a first terminal and a second terminal, said second terminal of said resistive component is connected to said second port of said IC, and said second terminal of said capacitive component and said first terminal of said resistive component are commonly connected to said third port of said voltage inverter.

10. The circuit of claim 1, said ESD pulse clamp means comprising a PMOS device having connections of gate electrode, source, drain and bulk, whereby said ESD pulse clamp means contains a first port and a second port and a third port.

11. The circuit of claim 10 wherein said first port of said ESD pulse clamp means is connected to said first terminal of said IC, said second port of said ESD pulse clamp means is connected to said second terminal of said IC, said third port of said ESD pulse clamp means is connected to said fourth port of said voltage inverter, said connections of bulk and drain of said PMOS device are commonly connected to said first port of said ESD pulse clamp means, said connection of source of said PMOS device is connected to said second port of said ESD pulse clamp means, said connection of gate of said PMOS device is connected to said third port of said ESD pulse clamp means.

12. An Electrostatic Discharge (ESD) protection circuit that is connected between a first terminal and a second terminal of an Integrated Circuit (IC), whereby said ESD protection circuit has an objective to dissipate an electrostatic pulse that originates from an ESD source that is connected between said first terminal and said second terminal thereby protecting said IC from potential damage that can be caused by exposure of said IC to extreme values of voltage from said ESD source, whereby said ESD protection circuit comprises:

an ESD pulse clamp means comprising a PMOS device for shunting said electrostatic pulse from said IC having a first port that is connected to said first terminal of said IC, a second port that is connected to said second terminal of said IC, and a third port;

an ESD pulse detection means having a first input port connected to said first terminal of said IC, a second input port connected to said second terminal of said IC, an output port that is connected to said third port of said ESD pulse clamp means, whereby in detecting a presence of said electrostatic pulse said ESD pulse detection means generates a voltage that triggers said ESD pulse clamp means thereby shunting said electrostatic pulse from said IC, wherein said ESD pulse detection means comprises a network comprising a resistive component having a first and a second terminal, a capacitive component having a first and a second terminal, and a voltage inverter, wherein said capacitive component of said ESD pulse detection means comprises:

a PMOS device having connections of gate electrode, source, drain and bulk, said connections of source, drain and bulk of said PMOS device are commonly connected to said second terminal of said capacitive component, said connection of gate is connected to said first terminal of said capacitive component; and a NMOS device having connections of gate electrode, source, drain and bulk whereby said connection of gate electrode is connected via a resistive load component to said second terminal of said capacitive component, said connection of source is connected to said second terminal of said capacitive component, said connection of drain is connected to said first terminal of said capacitive component, said connection of bulk is connected to said second terminal of said resistive component.

13. The circuit of claim 2 wherein said capacitive component of said ESD pulse detection means comprises a PMOS device having connections of gate electrode, source, drain and bulk, said connections of source, drain and bulk of said PMOS device are commonly connected to said first terminal of said capacitive component, said connection of gate is connected to said second terminal of said capacitive component.

14. An Electrostatic Discharge (ESD) protection circuit that is connected between a first terminal and a second terminal of an Integrated Circuit (IC), whereby said ESD protection circuit has an objective to dissipate an electrostatic pulse that originates from an ESD source that is connected between said first terminal and said second terminal thereby protecting said IC from potential damage that can be caused by exposure of said IC to extreme values of voltage from said ESD source, whereby said ESD protection circuit comprises:

an ESD pulse clamp means comprising a PMOS device for shunting said electrostatic pulse from said IC having a first port that is connected to said first terminal of said IC, a second port that is connected to said second terminal of said IC, and a third port;

an ESD pulse detection means having a first input port connected to said first terminal of said IC, a second input port connected to said second terminal of said IC, an output port that is connected to said third port of said ESD pulse clamp means, whereby in detecting a presence of said electrostatic pulse said ESD pulse detection means generates a voltage that triggers said ESD pulse clamp means thereby shunting said electrostatic pulse from said IC, wherein said ESD pulse detection means comprises a network comprising a resistive component having a first and a second terminal, a capacitive component having a first and a second terminal, and a voltage inverter, wherein said capacitive component of said ESD pulse detection means comprises a PMOS device having connections of gate electrode, source, drain and bulk, said connections of source, drain and bulk of said PMOS device are commonly connected to said second terminal of said capacitive component, said connection of gate is connected to said first terminal of said capacitive, said capacitive component further comprises a NMOS device having connections of gate electrode, source, drain and bulk, said connection of gate electrode is connected via a resistive load component to said second terminal of said capacitive component, said connection of source is connected to said second terminal of said capacitive component, said connection of drain is connected to said first terminal of said capacitive component, said connection of bulk is connected to said second terminal of said resistive component; and wherein said resistive component comprises a PMOS device having connections of gate electrode, source, drain and bulk, said connection of gate is connected via a resistive load to said second terminal of said resistive component, said connection of source is connected to said second terminal of said resistive component, said connections of drain and of bulk are commonly connected to said first terminal of said resistive load.

15. An Electrostatic Discharge (ESD) protection circuit that is connected between a first terminal and a second terminal of an Integrated Circuit (IC), whereby said ESD protection circuit has an objective to dissipate an electrostatic pulse that originates from an ESD source that is connected between said first terminal and said second terminal thereby protecting said IC from potential damage that can be caused by exposure of said IC to extreme values of voltage from said ESD source, whereby said ESD protection circuit comprises:

an ESD pulse clamp means comprising a PMOS device for shunting said electrostatic pulse from said IC having a first port that is connected to said first terminal of said IC, a second port that is connected to said second terminal of said IC, and a third port;

an ESD pulse detection means having a first input port connected to said first terminal of said IC, a second input port connected to said second terminal of said IC, an output port that is connected to said third port of said ESD pulse clamp means, whereby in detecting a presence of said electrostatic pulse said ESD pulse detection means generates a voltage that triggers said ESD pulse clamp means thereby shunting said electrostatic pulse from said IC, wherein said ESD pulse detection means comprises a network comprising a resistive component having a first and a second terminal, a capacitive component having a first and a second terminal, and a voltage inverter, wherein said capacitive component of said ESD pulse detection means comprises a PMOS device having connections of gate electrode, source, drain and bulk, said connections of source, drain and bulk of said PMOS device are commonly connected to said first terminal of said capacitive component, said connection of gate is connected to said second terminal of said capacitive component; and wherein said resistive component of said ESD pulse detection means comprises a NMOS device having connections of gate electrode, source, drain and bulk, said connections of source and bulk of said NMOS device are commonly connected to said second terminal of said resistive component, said connection of gate is connected via a resistive load to said first terminal of said capacitive component, said connection of drain of said NMOS device is connected to said first terminal of said resistive component.

16. An Electrostatic Discharge (ESD) protection circuit that is connected between a first terminal and a second terminal of an Integrated Circuit (IC), whereby said ESD protection circuit has an objective to dissipate an electrostatic pulse that originates from an ESD source that is connected between said first terminal and said second terminal thereby protecting said IC from potential damage that can be caused by exposure of said IC to extreme values of voltage from said ESD source, whereby said ESD protection circuit comprises:

a ESD pulse clamp means comprising a PMOS device for shunting said electrostatic pulse from said IC having a first port that is connected to said first terminal of said IC, a second port that is connected to said second terminal of said IC, and a third port; and an ESD pulse detection means having a first input port connected to said first terminal of said IC, a second input port connected to said second terminal of said IC, an output port that is connected to said third port of said ESD pulse clamp means, whereby in detecting a presence of said electrostatic pulse said ESD pulse detection means generates a voltage that triggers said ESD pulse clamp means thereby shunting said electrostatic pulse from said IC, wherein said PMOS device having connections of gate electrode, source, drain and bulk, whereby said ESD pulse clamp means contains a first port and a second port and a third port, wherein said first port of said ESD pulse clamp means is connected to said first terminal of said IC, said second port of said ESD pulse clamp means is connected to said second terminal of said IC, said third port of said ESD pulse clamp means is connected to said fourth port of said voltage inverter, said connection of source of said PMOS device is connected to said second port of said ESD pulse clamp means, said connection of drain of said PMOS device is connected to said first port of said voltage inverter, said connection of gate of said PMOS device is connected to said third port of said voltage inverter, said connection of bulk of said PMOS device is connected to said connection of gate of said PMOS device via well resistance that is present in the N-well underlying said PMOS device.

17. The circuit of claim 16 wherein said capacitive component of said ESD pulse detection means comprises parasitic capacitance that is present between said third port of said voltage inverter and said first terminal of said IC.

18. An Electrostatic Discharge (ESD) protection circuit that is connected between a first terminal and a second terminal of an Integrated Circuit (IC), whereby said ESD protection circuit has an objective to dissipate an electrostatic pulse that originates from an ESD source that is connected between said first terminal and said second terminal thereby protecting said IC from potential damage that can be caused by exposure of said IC to extreme values of voltage from said ESD source, whereby said ESD protection circuit comprises:

a ESD pulse clamp means comprising a PMOS device for shunting said electrostatic pulse from said IC having a first port that is connected to said first terminal of said IC, a second port that is connected to said second terminal of said IC, and a third port; and an ESD pulse detection means having a first input port connected to said first terminal of said IC, a second input port connected to said second terminal of said IC an output port that is connected to said third port of said ESD pulse clamp means, whereby in detecting a presence of said electrostatic pulse said ESD pulse detection means generates a voltage that triggers said ESD pulse clamp means thereby shunting said electrostatic pulse from said IC, wherein said PMOS device having connections of gate electrode, source, drain and bulk, whereby said ESD pulse clamp means contains a first port and a second port and a third port, wherein said first port of said ESD pulse clamp means is connected to said first terminal of said IC, said second port of said ESD pulse clamp means is connected to said second terminal of said IC, said third port of said ESD pulse clamp means is connected to said fourth port of said voltage inverter, said connection of bulk of said PMOS device to connected to said third port of said ESD pulse clamp means via well resistance that is present in a N-well underlying said PMOS device, said connection of source said PMOS device is connected to said first port of said ESD pulse clamp means, said connection of drain of said PMOS device is connected to said second port of said IC, said connection of gate of said PMOS device is connected to said first port of said ESD pulse clamp means via a resistive load.

19. The circuit of claim 18 wherein said capacitive component of said ESD pulse detection means comprises parasitic capacitance that is present between said third port of said voltage inverter and sand first terminal of said IC.

20. An Electrostatic Discharge (ESD) protection circuit that is connected between a first terminal and a second terminal of an Integrated Circuit (IC), whereby said ESD protection circuit has an objective to dissipate an electrostatic pulse that originates from an ESD source that is connected between said first terminal and said second terminal thereby protecting said IC from protection damage that can be caused by exposure of said IC to extreme values of voltage from said ESD source, whereby said ESD protection circuit comprises:

an ESD pulse clamp means comprising a PMOS device for shunting said electrostatic pulse from said IC having a first port that is connected to said first terminal of said IC, a second port that is connected to said second terminal of said IC, and a third port;

an ESD pulse detection means having a first input port connected to said first terminal of said IC, a second input port connected to said second terminal of said IC, an output port that is connected to said third port of said ESD pulse clamp means;

said ESD pulse detection means containing a network comprising a resistive component, a capacitive component, and a voltage inverter directly controlling a gate electrode of said PMOS device of said ESD pulse clamp means;

said voltage inverter of said ESD pulse detection means comprising a PMOS device having connections of gate electrode, source, drain and bulk, and a NMOS device having connections of gate electrode, source, drain and bulk, whereby said voltage inverter contains a first port, a second port, a third port, and a fourth port, said first port of said voltage inverter is connected to said first terminal of said IC, said second port of said voltage inverter is connected to said second terminal of said IC, said connections of gate of said PMOS device and said NMOS device are commonly connected to said third port of said voltage inverter, said connection of bulk and drain of said PMOS device is commonly connected to said first port of said voltage inverter, said connection of source and said connection of bulk of said NMOS device are commonly connected to said second port of said voltage inverter, said connection of source of said PMOS device and said connection of drain of said NMOS device are commonly connected to said fourth port of said NMOS device are commonly connected to said fourth port of said voltage inverter;

said capacitive component of said ESD pulse detection means comprising a first terminal and a second terminal, said first terminal of said capacitive component being connected to said first terminal of said IC;

said resistive component of said ESD pulse detection means comprising a first terminal and a second terminal, said second terminal of said resistive component being connected to said second terminal of said IC, and said second terminal of said capacitive component and said first terminal of said resistive component being commonly connected to said third port of said voltage inverter; and said ESD pulse clamp means comprising a PMOS device having connections of gate electrode, source, drain and bulk, whereby said ESD pulse clamp means contains a first port and a second port and a third port, said first port of said ESD pulse clamp means is connected to said first terminal of said IC, said second port of said ESD pulse clamp means is connected to said second terminal of said IC, said third port of said ESD pulse clamp means is connected to said fourth port of said voltage inverter, said connections of bulk and drain of said PMOS device are commonly connected to said first port of said ESD pulse clamp means, said connection of source of said PMOS device is connected to said second port of said ESD pulse clamp means, said connection of gate said PMOS device is connected to said third port of said ESD pulse clamp means.

21. An Electrostatic Discharge (ESD) protection circuit that is connected between a first terminal and a second terminal of an Integrated Circuit (IC), whereby said ESD protection circuit has as objective to dissipate an electrostatic pulse that originates from an ESD source that is connected between said first terminal and said second terminal thereby protecting said IC from potential damage that can be caused by exposure of said IC to extreme values of voltage from said ESD source, whereby said ESD protection circuit comprises:

an ESD pulse clamp means for shunting said electrostatic pulse from said IC having a first port that is connected to said first terminal of said IC, a second port that is connected to said second terminal of said IC, and a third port;

an ESD pulse detection means having a first input port connected to said first terminal of said IC, a second input port connected to said second terminal of said IC, an output port that is connected to said third port of said ESD pulse clamp means;

said ESD pulse detection means containing a network comprising a resistive component having a first and a second terminal, a capacitive component having a first and a second terminal, and a voltage inverter;

said voltage inverter of said ESD pulse detection means comprising a PMOS device having connections of gate electrode, source, drain and bulk, and a NMOS device having connections of gate electrode, source, drain and bulk, whereby said voltage inverter contains a first port, a second port, a third port, and a fourth port, said first port of said voltage inverter is connected to said first terminal of said IC, said second port of said voltage inverter is connected to said second terminal of said IC, said connections of gate of said PMOS device and said NMOS device are commonly connected to said third port of said voltage inverter, said connections of bulk and drain of said PMOS device are commonly connected to said first port of said voltage inverter, said connection of source and said connection of bulk of said NMOS device are commonly connected to said second port of said voltage inverter, said connection of source of said PMOS device and said connection of drain of said NMOS device are commonly connected to said fourth port of said voltage inverter;

said capacitive component of said ESD pulse detection means comprises a PMOS device having connections of gate electrode, source, drain and bulk, said connections of source, drain and bulk of said PMOS device are commonly connected to said second terminal of said capacitive component, said connection of gate is connected to said first terminal of said capacitive component, said capacitive component also comprising a NMOS device having connections of gate electrode, source, drain and bulk whereby said connection of gate electrode is connected via a resistive load component to said second terminal of said capacitive component, said connection of source is connected to said second terminal of said capacitive component, said connection of drain is connected to said first terminal of said capacitive component, said connection of bulk is connected to said second terminal of said resistive component;

said resistive component of said ESD pulse detection means comprising a first terminal and a second terminal, said second terminal of said resistive component being connected to said second terminal of said IC, and said second terminal of said capacitive component and said first terminal of said resistive component being commonly connected to said third port of said voltage inverter; and said ESD pulse clamp means comprising a PMOS device having connections of gate electrode, source, drain and bulk, whereby said ESD pulse clamp means contains a first port and a second port and a third port, said first port of said ESD pulse clamp means is connected to said first terminal of said IC, said second port of said ESD pulse clamp means is connected to said second terminal of said IC, said third port of said ESD pulse clamp means is connected to said fourth port of said voltage inverter, said connections of bulk and drain of said PMOS device are commonly connected to said first port of said ESD pulse clamp means, said connection of source of said PMOS device is connected to said second port of said ESD pulse clamp means, said connection of gate said PMOS device is connected to said third port of said ESD pulse clamp means.

22. An Electrostatic Discharge (ESD) protection circuit that is connected between a first terminal and a second terminal of an Integrated Circuit (IC), whereby said ESD protection circuit has an objective to dissipate an electrostatic pulse that originates from an ESD source that is connected between said first terminal and said second terminal thereby protecting said IC from potential damage that can be caused by exposure of said IC to extreme values of voltage from said ESD source, whereby said ESD protection circuit comprises:

an ESD pulse clamp means comprising a PMOS device for shunting said electrostatic pulse from said IC having a first port that is connected to said first terminal of said IC, a second port that is connected to said second terminal of said IC, and a third port;

an ESD pulse detection means having a first input port connected to said first terminal of said IC, a second input port connected to said second terminal of said IC, an output port that is connected to said third port of said ESD pulse clamp means;

said ESD pulse detection means containing a network comprising a resistive component having a first and a second terminal, a capacitive component having a first and a second terminal, and a voltage inverter directly controlling a gate electrode of said PMOS device of said ESD pulse clamp means;

said voltage inverter of said ESD pulse detection means comprising a PMOS device having connections of gate electrode, source, drain and bulk, and a NMOS device having connections of gate electrode, source, drain and bulk, whereby said voltage inverter contains a first port, a second port, a third port, and a fourth port, said first port of said voltage inverter is connected to said first terminal of said IC, said second port of said voltage inverter is connected to said second terminal of said IC, said connections of gate of said PMOS device and said NMOS device are commonly connected to said third port of said voltage inverter, said connections of bulk and drain of said PMOS device are commonly connected to said first port of said voltage inverter, said connection of source and said connection of bulk of said NMOS device are commonly connected to said second port of said voltage inverter, said connection of source of said PMOS device and said connection of drain of said NMOS device are commonly connected to said fourth port of said voltage inverter;

said capacitive component of said ESD pulse detection means comprises a PMOS device having connections of gate electrode, source, drain and bulk whereby said connections of source, drain and bulk of said PMOS device are commonly connected to said first terminal of said capacitive component, said connection of gate is connected to said second terminal of said capacitive component, said resistive component of said ESD pulse detection means comprising a first terminal and a second terminal, said second terminal of said resistive component being connected to said second terminal of said IC, and said second terminal of said capacitive component and said first terminal of said resistive component being commonly connected to said third port of said voltage inverter; and said ESD pulse clamp means comprising a PMOS device having connections of gate electrode, source, drain and bulk, whereby said ESD pulse clamp means contains a first port and a second port and a third port, said first port of said ESD pulse clamp means is connected to said first terminal of said IC, said second port of said ESD pulse clamp means is connected to said second terminal of said IC, said third port of said ESD pulse clamp means is connected to said fourth port of said voltage inverter, said connections of bulk and drain of said PMOS device are commonly connected to said first port of said ESD pulse clamp means, said connection of source of said PMOS device is connected to said second port of said ESD pulse clamp means, said connection of gate said PMOS device is connected to said third port of said ESD pulse clamp means.

23. An Electrostatic Discharge (ESD) protection circuit that is connected between a first terminal and a second terminal of an Integrated Circuit (IC), whereby said ESD protection circuit has as objective to dissipate an electrostatic pulse that originates from an ESD source that is connected between said first terminal and said second terminal thereby protecting said IC from potential damage that can be caused by exposure of said IC to extreme values of voltage from said ESD source, whereby said ESD protection circuit comprises:

an ESD pulse clamp means for shunting said electrostatic pulse from said IC having a first port that is connected to said first terminal of said IC, a second port that is connected to said second terminal of said IC, and a third port;

an ESD pulse detection means having a first input port connected to said first terminal of said IC, a second input port connected to said second terminal of said IC, an output port that is connected to said third port of said ESD pulse clamp means;

said ESD pulse detection means containing a network comprising a resistive component having a first and a second terminal, a capacitive component having a first and a second terminal, and a voltage inverter;

said voltage inverter of said ESD pulse detection means comprising a PMOS device having connections of gate electrode, source, drain and bulk, and a NMOS device having connections of gate electrode, source, drain and bulk, whereby said voltage inverter contains a first port, a second port, a third port, and a fourth port, said first port of said voltage inverter is connected to said first terminal of said IC, said second port of said voltage inverter is connected to said second terminal of said IC, said connections of gate of said PMOS device and said NMOS device are commonly connected to said third port of said voltage inverter, said connections of bulk and drain of said PMOS device are commonly connected to said first port of said voltage inverter, said connection of source and said connection of bulk of said NMOS device are commonly connected to said second port of said voltage inverter, said connection of source of said PMOS device and said connection of drain of said NMOS device are commonly connected to said fourth port of said voltage inverter;

said capacitive component of said ESD pulse detection means comprises a PMOS device having connections of gate electrode, source, drain and bulk, said connections of source, drain and bulk of said PMOS device are commonly connected to said second terminal of said capacitive component, said connection of gate is connected to said first terminal of said capacitive component, said capacitive component further comprises a NMOS device having connections of gate electrode, source, drain and bulk, said connection of gate electrode is connected via a resistive load component to said second terminal of said capacitive component, said connection of source is connected to said second terminal of said capacitive component, said connection of drain is connected to said first terminal of said capacitive component, said connection of bulk is connected to said second terminal of said resistive component;

said resistive component comprises a PMOS device having connections of gate electrode, source, drain and bulk, said connection of gate is connected via a resistive load to said second terminal of said resistive component, said connection of source is connected to said second terminal of said resistive component, said connections of drain and of bulk are commonly connected to said first terminal of said resistive loads; and said ESD pulse clamp means comprising a PMOS device having connections of gate electrode, source, drain and bulk, whereby said ESD pulse clamp means contains a first port and a second port and a third port, said first port of said ESD pulse clamp means is connected to said first terminal of said IC, said second port of said ESD pulse clamp means is connected to said second terminal of said IC, said third port of said ESD pulse clamp means is connected to said fourth port of said voltage inverter, said connections of bulk and drain of said PMOS device are commonly connected to said first port of said ESD pulse clamp means, said connection of source of said PMOS device is connected to said second port of said ESD pulse clamp means, said connection of gate of said PMOS device is connected to said third port of said ESD pulse clamp means.

24. An Electrostatic Discharge (ESD) protection circuit that is connected between a first terminal and a second terminal of an Integrated Circuit (IC), whereby said ESD protection circuit has as objective to dissipate an electrostatic pulse that originates from an ESD source that is connected between said first terminal and said second terminal thereby protecting said IC from potential damage that can be caused by exposure of said IC to extreme values of voltage from said ESD source, whereby said ESD protection circuit comprises:

an ESD pulse clamp means for shunting said electrostatic pulse from said IC having a first port that is connected to said first terminal of said IC, a second port that is connected to said second terminal of said IC, and a third port;

an ESD pulse detection means having a first input port connected to said first terminal of said IC, a second input port connected to said second terminal of said IC, an output port that is connected to said third port of said ESD pulse clamp means;

said ESD pulse detection means containing a network comprising a resistive component having a first and a second terminal, a capacitive component having a first and a second terminal, and a voltage inverter;

said voltage inverter of said ESD pulse detection means comprising a PMOS device having connections of gate electrode, source, drain and bulk, and a NMOS device having connections of gate electrode, source, drain and bulk, whereby said voltage inverter contains a first port, a second port, a third port, and a fourth port, said first port of said voltage inverter is connected to said first terminal of said IC, said second port of said voltage inverter is connected to said second terminal of said IC, said connections of gate of said PMOS device and said NMOS device are commonly connected to said third port of said voltage inverter, said connections of bulk and drain of said PMOS device are commonly connected to said first port of said voltage inverter, said connection of source and said connection of bulk of said NMOS device are commonly connected to said second port of said voltage inverter, said connection of source of said PMOS device and said connection of drain of said NMOS device are commonly connected to said fourth port of said voltage inverter; said capacitive component of said ESD pulse detection means comprises a PMOS device having connections of gate electrode, source, drain and bulk, said connections of source, drain and bulk of said PMOS device are commonly connected to said first terminal of said capacitive component, said connection of gate is connected to said second terminal of said capacitive component;

said resistive component of said ESD pulse detection means comprises a NMOS device having connections of gate electrode, source, drain and bulk, said connections of source and bulk of said NMOS device are commonly connected to said second port of said resistive component, said connection of gate is connected via a resistive load to said first port of said capacitive component, said connection of drain of said NMOS device is connected to said first terminal of said resistive component; and said ESD pulse clamp means comprising a PMOS device having connections of gate electrode, source, drain and bulk, whereby said ESD pulse clamp means contains a first port and a second port and a third port, said first port of said ESD pulse clamp means is connected to said first terminal of said IC, said second port of said ESD pulse clamp means is connected to said second terminal of said IC, said third port of said ESD pulse clamp means is connected to said fourth port of said voltage inverter, said connections of bulk and drain of said PMOS device are commonly connected to said first port of said ESD pulse clamp means, said connection of source of said PMOS device is connected to said second port of said ESD pulse clamp means, said connection of gate said PMOS device is connected to said third port of said ESD pulse clamp means.

25. An Electrostatic Discharge (ESD) protection circuit that is connected between a first terminal and a second terminal of an Integrated Circuit (IC), whereby said ESD protection circuit has as objecting to dissipate an electrostatic pulse that originates from an ESD source that is connected between said first terminal and said second terminal thereby protecting said IC from potential damage that can be caused by exposure of said IC to extreme values of voltage from said ESD source, whereby said ESD protection circuit comprises:

an ESD pulse clamp means for shunting said electrostatic pulse from said IC having a first port that is connected to said first terminal of said IC, a second port that is connected to said second terminal of said IC, and a third port;

an ESD pulse detection means having a first input port connected to said first terminal of said IC, a second input port connected to said second terminal of said IC, an output port that is connected to said third port of said ESD pulse clamp means;

said ESD pulse detection means containing a network comprising a resistive component having a first and a second terminal, a capacitive component having a first and a second terminal, and a voltage inverter;

said voltage inverter of said ESD pulse detection means comprising a PMOS device having connections of gate electrode, source, drain and bulk, and a NMOS device having connections of gate electrode, source, drain and bulk, whereby said voltage inverter contains a first port, a second port, a third port, and a fourth port, said first port of said voltage inverter is connected to said first terminal of said IC, said second port of said voltage inverter is connected to said second terminal of said IC, said connections of gate of said PMOS device and said NMOS device are commonly connected to said third port of said voltage inverter, said connections of bulk and drain of said PMOS device are commonly connected to said first port of said voltage inverter, said connection of source and said connection of bulk of said NMOS device are commonly connected to said second port of said voltage inverter, said connection of source of said PMOS device and said connection of drain of said NMOS device are commonly connected to said fourth port of said voltage inverter;

said capacitive component of said ESD pulse detection means comprising a first terminal and a second terminal, said first terminal of said capacitive component being connected to said first terminal of said IC; and said resistive component of said ESD pulse detection means comprising a first terminal and a second terminal, said second terminal of said resistive component being connected to said second terminal of said IC, and said second terminal of said capacitive component of said pulse detector and said first terminal of said resistive component of said pulse detector being commonly connected to said third port of said voltage inverter; said first port of said ESD pulse clamp means is connected to said first terminal of said IC, said second port of said ESD pulse clamp means is connected to said second terminal of said IC, said third port of said ESD pulse clamp means is connected to said fourth port of said voltage inverter, said connection of source of said PMOS device is connected to said second port of said ESD pulse clamp means, said connection of drain of said PMOS device is connected to said first port of said voltage inverter, said connection of gate of said PMOS device is connected to said third port of said voltage inverter, said connection of bulk of said PMOS device is connected to said connection of gate of said PMOS device via well resistance that is present in the N-well underlying said PMOS device.

26. An Electrostatic Discharge (ESD) protection circuit that is connected between a first terminal and a second terminal of an Integrated Circuit (IC), whereby said ESD protection circuit has as objective to dissipate an electrostatic pulse that originates from an ESD source that is connected between said first terminal and said second terminal thereby protecting said IC from potential damage that can be caused by exposure of said IC to extreme values o voltage from said ESD source, whereby said ESD protection circuit comprises:

an ESD pulse clamp means for shunting said electrostatic pulse from said IC having a first port that is connected to said first terminal of said IC, a second port that is connected to said second terminal of said IC, and a third port;

an ESD pulse detection means having a first input port connected to said first terminal of said IC, a second input port connected to said second terminal of said IC, an output port that is connected to said third port of said ESD pulse clamp means;

said ESD pulse detection means containing a network comprising a resistive component having a first and a second terminal, a capacitive component having a first and a second terminal, and a voltage inverter;

said voltage inverter of said ESD pulse detection means comprising a PMOS device having connections of gate electrode, source, drain and bulk, and a NMOS device having connections of gate electrode, source, drain and bulk, whereby said voltage inverter contains a first port, a second port, a third port, and a fourth port, said first port of said voltage inverter is connected to said first terminal of said IC, said second port of said voltage inverter is connected to said second terminal of said IC, said connections of gate of said PMOS device and said NMOS device are commonly connected to said third port of said voltage inverter, said connection of bulk and drain of said PMOS device are commonly connected to said first port of said voltage inverter, said connection of source and said connection of bulk of said NMOS device is commonly connected to said second port of said voltage inverter, said connection of source of said PMOS device and said connection of drain of said NMOS device are commonly connected to said fourth port of said voltage inverter;

said capacitive component of said ESD pulse detection means comprising a first terminal and a second terminal, said first terminal of said capacitive component being connected to said first terminal of said IC;

said resistive component of said ESD pulse detection means comprising a first terminal and a second terminal, said second terminal of said resistive component being connected to said second terminal of said IC, and said second terminal of said capacitive component and said first terminal of said resistive component being commonly connected to said third port of said voltage inverter; and said first port of said ESD pulse clamp means is connected to said first terminal of said IC, said second port of said ESD pulse clamp means is connected to said second terminal of said IC, said third port of said ESD pulse clamp means is connected to said fourth port of said voltage inverter, said connection of bulk of said PMOS device to connected to said third port of said ESD pulse clamp means via well resistance that is present in a N-well underlying said PMOS device, said connection of source said PMOS device is connected to said first port of said ESD pulse clamp means, said connection of drain of said PMOS device is connected to said second port of said IC, said connection of gate of said PMOS device is connected to said first port of said ESD pulse clamp means via a resistive load.

27. An Electrostatic Discharge (ESD) protection circuit that is connected between a first terminal and a second terminal of an Integrated Circuit (IC), whereby said ESD protection circuit has as objective to dissipate an electrostatic pulse that originates from an ESD source that is connected between said first terminal and said second terminal thereby protecting said IC from potential damage that can be caused by exposure of said IC to extreme values of voltage from said ESD source, whereby said ESD protection circuit comprises:

an ESD pulse clamp means for shunting said electrostatic pulse from said IC having a first port that is connected to said first terminal of said IC, a second port that is connected to said second terminal of said IC, and a third port;

an ESD pulse detection means having a first input port connected to said first terminal of said IC, a second input port connected to said second terminal of said IC, an output port that is connected to said third port of said ESD pulse clamp means;

said ESD pulse detection means containing a network comprising a resistance component having a first and a second terminal, a capacitive component having a first and a second terminal, and a voltage inverter;

said voltage inverter of said ESD pulse detection means comprising a PMOS device having connections of gate electrode, source, drain and bulk, and a NMOS device having connections of gate electrode, source, drain and bulk, whereby said voltage inverter contains a first port, a second port, a third port, and a fourth port, said first port of said voltage inverter is connected to said first terminal of said IC, said second port of said voltage inverter is connected to said second terminal of said IC, said connections of gate of said PMOS device and said NMOS device are commonly connected to said third port of said voltage inverter, said connections of bulk and drain of said PMOS device are commonly connected to said first port of said voltage inverter, said connection of source and said connection of bulk of said NMOS device are commonly connected to said second port of said voltage inverter, said connection of source of said PMOS device and said connection of drain of said NMOS device are commonly connected to said fourth port of said voltage inverter;

said capacitive component of said ESD pulse detection means comprises parasitic capacitance that is present between said third port of said voltage inverter and said first port of said IC;

said resistive component of said ESD pulse detection means comprising a first terminal and a second terminal, said second terminal of said resistive component being connected to said second port of said IC, and said first terminal of said being connected to said third port of said voltage inverter; and said ESD pulse clamp means comprising a PMOS device having connections of gate electrode, source, drain and bulk, whereby said ESD pulse clamp means contains a first port and a second port and a third port, said first port of said ESD pulse clamp means is connected to said first terminal of said IC, said second port of said ESD pulse clamp means is connected to said second terminal of said IC, said third port of said ESD pulse clamp means is connected to said fourth port of said voltage inverter, said connection of source of said PMOS device is connected to said second port of said ESD pulse clamp means, said connection of drain of said PMOS device is connected to said first port of said voltage inverter, said connection of gate of said PMOS device is connected to said third port of said voltage inverter, said connection of bulk of said PMOS device is connected to said connection of gate of said PMOS device via well resistance that is present in the N-well underlying said PMOS device.

28. An Electrostatic Discharge (ESD) protection circuit that is connected between a first terminal and a second terminal of an Integrated Circuit (IC), whereby said ESD protection circuit has as objective to dissipate an electrostatic pulse that originates from an ESD source that is connected between said first terminal and said second terminal thereby protecting said IC from potential damage that can be caused by exposure of said IC to extreme values of voltage from said ESD source, whereby said ESD protection circuit comprises:

an ESD pulse clamp means for shunting said electrostatic pulse from said IC having a first port that is connected to said first terminal of said IC, a second port that is connected to said second terminal of said IC, and a third port;

an ESD pulse detection means having a first input port connected to said first terminal of said IC, a second input port connected to said second terminal of said IC, an output port that is connected to said third port of said ESD pulse clamp means;

said ESD pulse detection means containing a network comprising a resistive component having a first and a second terminal, a capacitive component having a first and a second terminal, and a voltage inverter;

said voltage inverter of said ESD pulse detection means comprising a PMOS device having connections of gate electrode, source, drain and bulk, and a NMOS device having connections of gate electrode, source, drain and bulk, whereby said voltage inverter contains a first port, a second port, a third port, and a fourth port, said first port of said voltage inverter is connected to said first terminal of said IC, said second port of said voltage inverter is connected to said second terminal of said IC, said connections of gate of said PMOS device and said NMOS device are commonly connected to said third port of said voltage inverter, said connections of bulk and drain of said PMOS device are commonly connected to said first port of said voltage inverter, said connection of source and said connection of bulk of said NMOS device are commonly connected to said second port of said voltage inverter, said connection of source of said PMOS device and said connection of drain of said NMOS device are commonly connected to said fourth port of said voltage inverter;

said capacitive component of said ESD pulse detection means comprises parasitic capacitance that is present between said third port of said voltage inverter and said first port of said IC;

said resistive component of said ESD pulse detection means comprising a first terminal and a second terminal, said second terminal of said resistive component being connected to said second terminal of said IC, and said second terminal of said resistive component being connected to said third port of said voltage inverter; and said ESD pulse clamp means comprising a PMOS device having connections of gate electrode, source, drain and bulk, whereby said ESD pulse clamp means contains a first port and a second port and a third port, wherein said first port of said ESD pulse clamp means is connected to said first terminal of said IC, said second port of said ESD pulse clamp means is connected to said second terminal of said IC, said third port of said ESD pulse clamp means is connected to said fourth port of said voltage inverter, said connection of bulk of said PMOS device is connected to said third port of said ESD pulse clamp means via well resistance that is present in a N-well underlying said PMOS device, said connection of source said PMOS device is connected to said first port of said ESD pulse clamp means, said connection of drain of said PMOS device is connected to said second port of said IC, said connection of gate of said PMOS device is connected to said first port of said ESD pulse clamp means via a resistive load.

* * * * *